United States Patent
Owen et al.

(10) Patent No.: US 10,153,781 B2
(45) Date of Patent: Dec. 11, 2018

(54) DECODER FOR LOW-DENSITY PARITY-CHECK CODES

(71) Applicant: Imagination Technologies Limited, Kings Langley (GB)

(72) Inventors: Christopher Owen, Stroud (GB); Adrian John Anderson, Chepstow (GB)

(73) Assignee: Imagination Technologies Limited, Kings Langley (GB)

( * ) Notice: Subject to any disclaimer, the term of this patent is extended or adjusted under 35 U.S.C. 154(b) by 733 days.

(21) Appl. No.: 14/340,497

(22) Filed: Jul. 24, 2014

(65) Prior Publication Data
US 2015/0067440 A1    Mar. 5, 2015

(30) Foreign Application Priority Data
Aug. 27, 2013 (GB) .................... 1315213.7

(51) Int. Cl.
*H03M 13/11* (2006.01)
*H03M 13/00* (2006.01)

(52) U.S. Cl.
CPC ...... *H03M 13/1111* (2013.01); *H03M 13/114* (2013.01); *H03M 13/1114* (2013.01);
(Continued)

(58) Field of Classification Search
CPC .......... H03M 13/1114; H03M 13/1137; H03M 13/114; H03M 13/1111; H03M 13/6516;
(Continued)

(56) References Cited

U.S. PATENT DOCUMENTS

| | | | |
|---|---|---|---|
| 7,770,090 B1* | 8/2010 | Kons | H03M 13/1137 714/780 |
| 2005/0138519 A1* | 6/2005 | Boutillon | H03M 13/1111 714/752 |

(Continued)

OTHER PUBLICATIONS

Low-density parity-check code, https://en.wikipedia.org/w/index.php?title=Low-density_parity-check_code&oldid=723429491, p. 9 (last visited Jun. 10, 2016).*

(Continued)

*Primary Examiner* — Kyle Vallecillo
(74) *Attorney, Agent, or Firm* — Vorys, Sater, Seymour and Pease LLP; Vincent M DeLuca

(57) ABSTRACT

Methods and apparatus for decoding LDPC codes provide that an LDPC code may be represented as a Tanner graph comprising bit nodes and check nodes and connections between them. In an embodiment, a configurable LDPC decoder, which supports many different LDPC codes having any sub-matrix size, comprises several independently addressable memories which are used to store soft decision data for each bit node. The decoder further comprises a number, P, of check node processing systems which generate updated soft decision data. The updated values are then passed back to the memories via a shuffling system. If the number of check nodes processed in parallel by the check node processing systems is $P_{CNB}$ (where $P \geq P_{CNB}$) and the soft decision data for a bit node is of word size q bits, the total width of the independently addressable memories is larger than $P_{CNB}*q$ bits.

20 Claims, 14 Drawing Sheets

(52) U.S. Cl.
CPC .... *H03M 13/1137* (2013.01); *H03M 13/1165* (2013.01); *H03M 13/611* (2013.01); *H03M 13/6516* (2013.01); *H03M 13/6566* (2013.01)

(58) Field of Classification Search
CPC ........... H03M 13/6566; H03M 13/611; H03M 13/1165
See application file for complete search history.

(56) References Cited

U.S. PATENT DOCUMENTS

| | | |
|---|---|---|
| 2006/0206778 A1 | 9/2006 | Wehn et al. |
| 2007/0033484 A1* | 2/2007 | Kim .................. H03M 13/1111 714/758 |
| 2007/0168833 A1* | 7/2007 | Lestable ............ H03M 13/6511 714/758 |
| 2007/0226585 A1* | 9/2007 | Park .................. H03M 13/1111 714/758 |
| 2009/0013238 A1 | 1/2009 | Blanksby et al. |
| 2009/0172493 A1 | 7/2009 | Park et al. |
| 2009/0222710 A1 | 9/2009 | Patapoutian et al. |
| 2011/0246850 A1 | 10/2011 | Rault et al. |
| 2013/0061107 A1 | 3/2013 | Wang et al. |
| 2013/0145231 A1 | 6/2013 | Frayer et al. |

OTHER PUBLICATIONS

Great Britain Application No. GB1418342.0 Search Report dated Nov. 26, 2014.

* cited by examiner

DECODER FOR LOW-DENSITY PARITY-CHECK CODES

BACKGROUND

Low-density parity-check (LDPC) codes, like other codes such as Hamming codes, use a number of bits for a given message word. Each parity check covers a different set of the message bits and the parity checks overlap so that any one message bit is covered by more than one parity check. This means that where there are a limited number of errors it is possible to identify the location of an error. LDPC codes are characterized by a parity check matrix, denoted H, which has a row for each parity check and a column for each bit in the total code word. For LCPC codes, these parity check matrices are very large and sparse (i.e. they comprise mostly zeros with only a few ones) which results in very long code words.

The parity check matrices, H, may also be represented in the form of a Tanner graph and FIG. 1 shows an example parity check matrix 102 and corresponding Tanner graph 104. The Tanner graph 104 shows bit nodes 106 and check nodes 108 and the connections (or edges) between them. There is one bit node for each bit in the code word (and these correspond to the columns in the parity check matrix 102) and one check node for each parity check (and these correspond to the rows in the parity check matrix 102).

LDPC codes are typically decoded using soft-in-soft-out methods in which a previous stage passes information into the decoder that describes the estimated value (1 or 0) for each bit and a confidence value associated with the estimate. The confidence value may be in the form of a Log-Likelihood Ratio (LLR). The decoder outputs information in the same form (i.e. estimated value and confidence associated with the estimate). The decoder uses an iterative message passing algorithm based on belief propagation to perform the decoding. According to an example of such an algorithm, the bit nodes tells the connected check nodes their current LLR estimate and using this information the check nodes perform their parity checks and provide information back to each connected bit node regarding the likelihood that the associated bit is a '1'. On receipt of the updated information, the bit nodes combine the values they receive from all the connected check nodes. The method is then repeated, with bit nodes providing updated LLRs to check nodes, although the value passed to any check node from a bit node may be different, such that a check node receives only 'new' information which indicates how the other connected check nodes modified the LLR in the previous iteration (i.e. a check node receives information relating to changes made by to the LLR by all the other connected check nodes except for itself). This method is an example of Two-Pass Message Passing (TPMP) and the decoding may be made more efficient by combining the two passes and the result may be a Merged-Schedule Messaging Passing (MSMP) algorithm.

Using MSMP the current LLR estimate for each bit node is used to calculate and store a value which represents the check node to bit node message and once a value has been calculated it is used to update a temporary variable which is the running total of LLR updates for each bit node. Once all check nodes have been processed (and their check node to bit node messages used to update the running totals), the running total is used to update a stored value of the LLR (the current LLR estimate) for each bit. As before, this method is then repeated.

There are many applications for LDPC codes as they have been found to provide a reliable and efficient method for transmitting data over a noisy transmission channel. Examples include use in many digital television standards (whether for terrestrial, satellite, cable or mobile use), such as DVB-T2, DVB-S2 and DVB-C2, and other wireless standards, such as WiMAX™ and some WiFi™ variants.

The embodiments described below are not limited to implementations which solve any or all of the disadvantages of known LDPC decoders.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Methods and apparatus for decoding LDPC codes are described. An LDPC code may be represented as a Tanner graph comprising bit nodes (one per bit in the code word) and check nodes (one per parity check) and connections between them. In an embodiment, a configurable LDPC decoder, which supports many different LDPC codes having any sub-matrix size, comprises several independently addressable memories which are used to store soft decision data for each bit node. The decoder further comprises a number, P, of check node processing systems which generate updated soft decision data. The updated values are then passed back to the memories via a shuffling system. If the number of check nodes processed in parallel by the check node processing systems is $P_{CNB}$ (where $P \geq P_{CNB}$) and the soft decision data for a bit node is of word size q bits, the total width of the independently addressable memories is larger than $P_{CNB}*q$ bits.

A first aspect provides configurable LDPC decoder arranged to support multiple different LDPC code structures having any sub-matrix size, the LDPC decoder comprising: a plurality of independently addressable memories arranged collectively to store soft decision data for each bit node for use in decoding an LDPC code and each memory having a width, the width of a memory comprising an amount of data accessible from the memory in a single cycle; a plurality of check node processing systems arranged to operate in parallel and generate updates to the bit node soft decision data; a first shuffling system arranged to pass data from the plurality of independently addressable memories to the plurality of check node processing systems; and a second shuffling system arranged to pass updates to the bit node soft decision data from the plurality of check node processing systems to the plurality of independently addressable memories; and wherein a total width of the plurality of independently addressable memories is larger than a product of a number of check nodes processed in parallel by the check node processing systems and a width of the soft decision data for a bit node.

A second aspect provides a method of decoding an LDPC code comprising: accessing, in a single cycle, soft decision data for a plurality of bit nodes from a plurality of independently addressable memories, each memory having a width and the width of a memory comprising an amount of data accessible from the memory in a single cycle; providing the accessed soft decision data to a plurality of check node processing systems; and generating updates to the soft decision data for the plurality of bit nodes in parallel in the check node processing systems; and storing updated soft decision data for the plurality of bit nodes in the plurality of independently addressable memories, and wherein in at least one cycle, accessing soft decision data for a plurality of bit nodes comprises accessing a total amount of soft decision data which is larger than a product of a number of check nodes processed in parallel by the check node processing systems and a width of the soft decision data for a bit node.

Further aspects provide an LDPC decoder substantially as described with reference to any of FIGS. 5, 7 and 9 of the drawings, a method substantially as described with reference to FIG. 14 of the drawings, a computer readable storage medium having encoded thereon computer readable program code for generating a processor comprising the LDPC decoder described herein, and a computer readable storage medium having encoded thereon computer readable program code for generating a processor configured to perform the method described herein.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

This acknowledges that firmware and software can be separately used and valuable. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
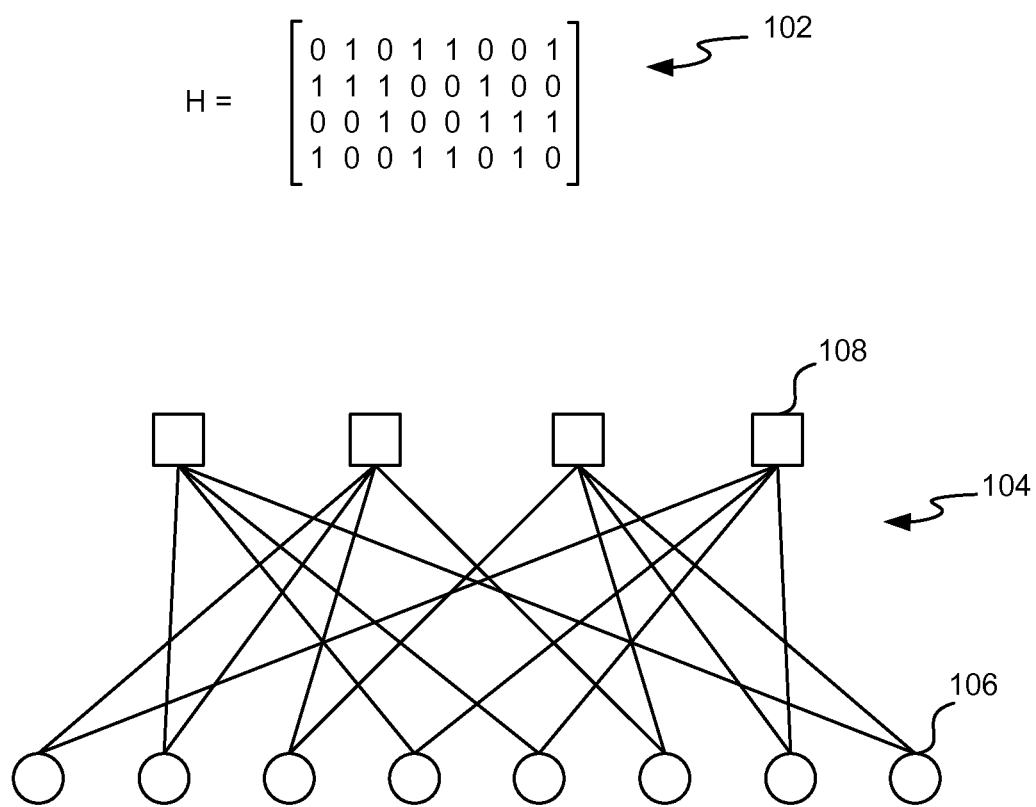
FIG. 1 shows an example parity check matrix and corresponding Tanner graph.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

The LDPC decoding algorithm described above involved storing all the bit node updates in a temporary variable (the running total) until the end of an iteration when all the updates are applied at once. This technique is known as flooding and if a given bit node is involved in a number of check node calculations, the same LLR estimate for the bit node is used in all calculations within an iteration. An alternative approach, however, allows check nodes that are processed first to update their connected bit nodes immediately (and hence update the current LLR estimate for those bit nodes). This means that subsequent check nodes within the same iteration use an updated LLR estimate. This approach is called layered decoding, requires less storage compared to flooding and results in the algorithm converging more quickly.

Figure 2:
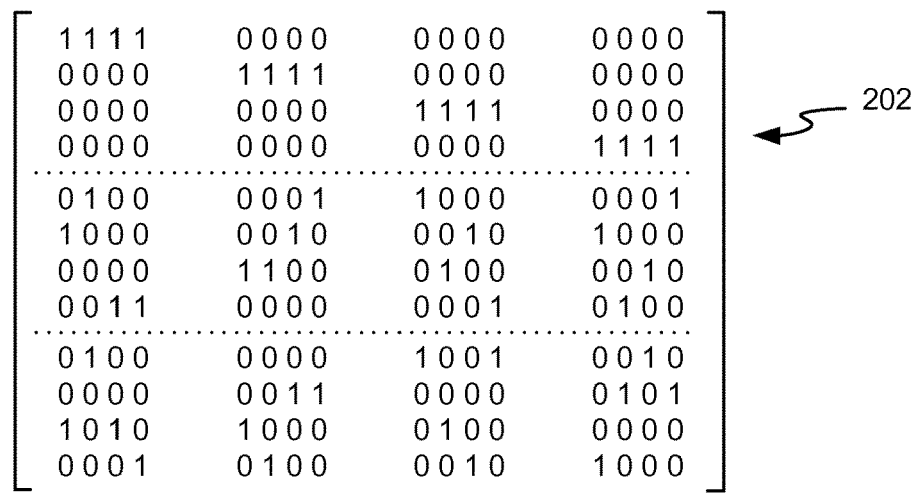
FIG. 2 shows two example parity check matrices.
Figure 2:
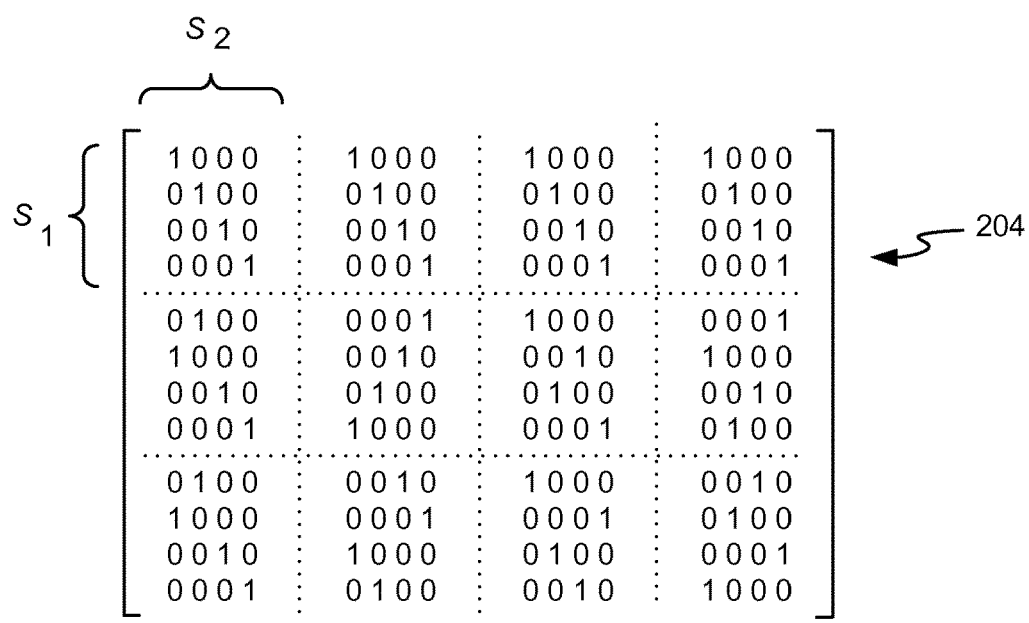

Some LDPC codes are designed for layered decoding and for these codes the parity check (or H) matrix is divided into layers with each layer consisting of a group of rows (i.e. a group of check nodes) and each layer only using a particular bit node once, as shown in the first example 202 of FIG. 2. As each row in a layer includes a different collection of bits, the rows within a layer can be processed in parallel, without any conflict being caused by two or more check nodes trying to update the same bit node simultaneously.

In some examples, in addition to dividing the H-matrix horizontally into layers, the matrix is further divided vertically, to form a set of sub-matrices, each of size $S_1$ by $S_2$, as shown in the second example 204 in FIG. 2. A row of sub-matrices constitutes a layer and each sub-matrix contains only one '1' per column as well as only one '1' per row. Codes constructed in this way are referred to as 'architecture aware' and result in a significant logic saving in the decoder compared to the previous example.

Figure 13:
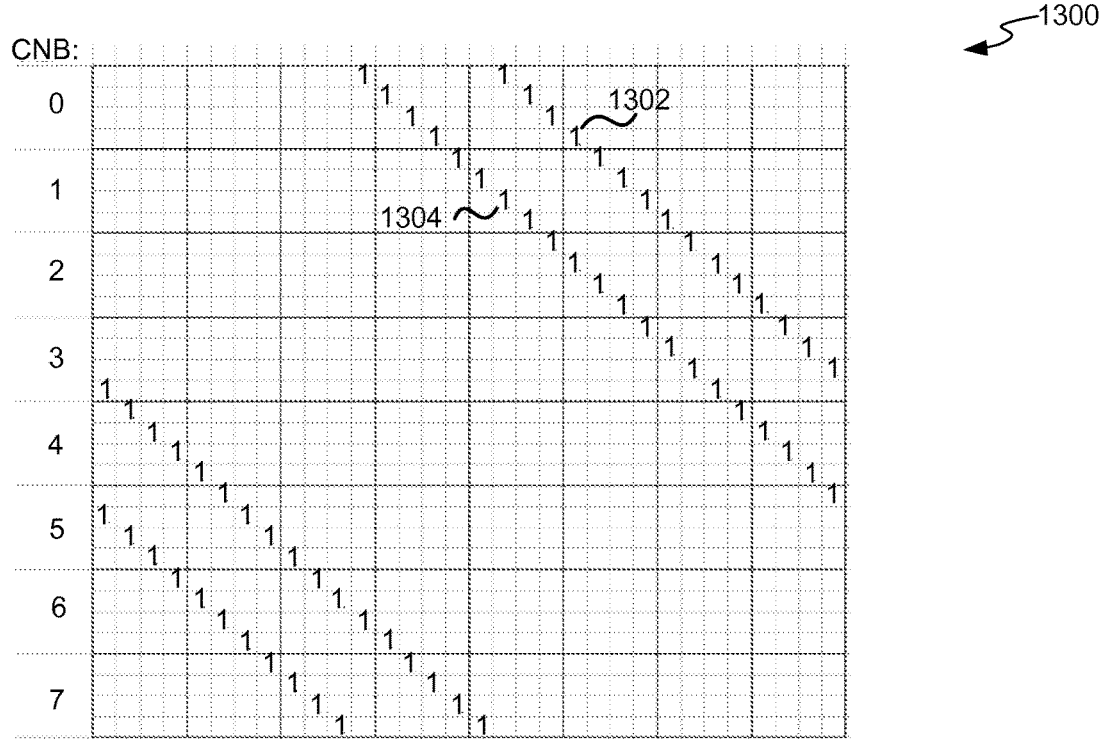
FIG. 13 shows two further example sub-matrices.
Figure 13:
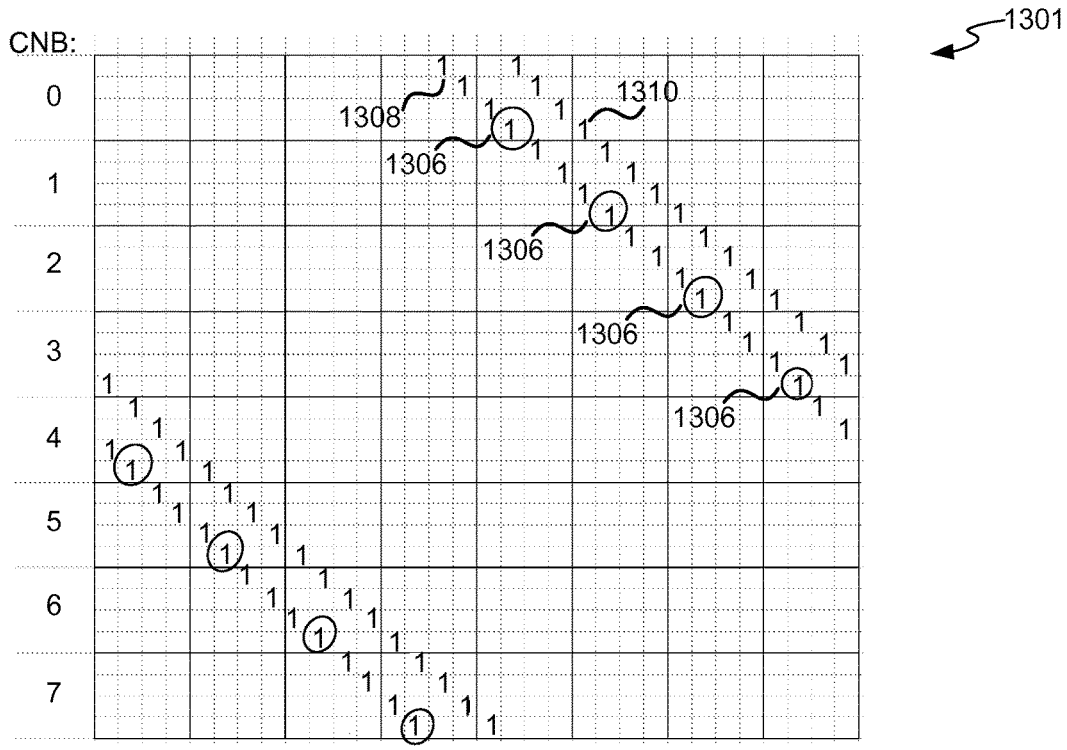

Although the following description refers to layered decoding, the methods may also be applied to non-layered codes, such as the DVB-T2 codes, as described below with reference to FIG. 13.

Figure 3:
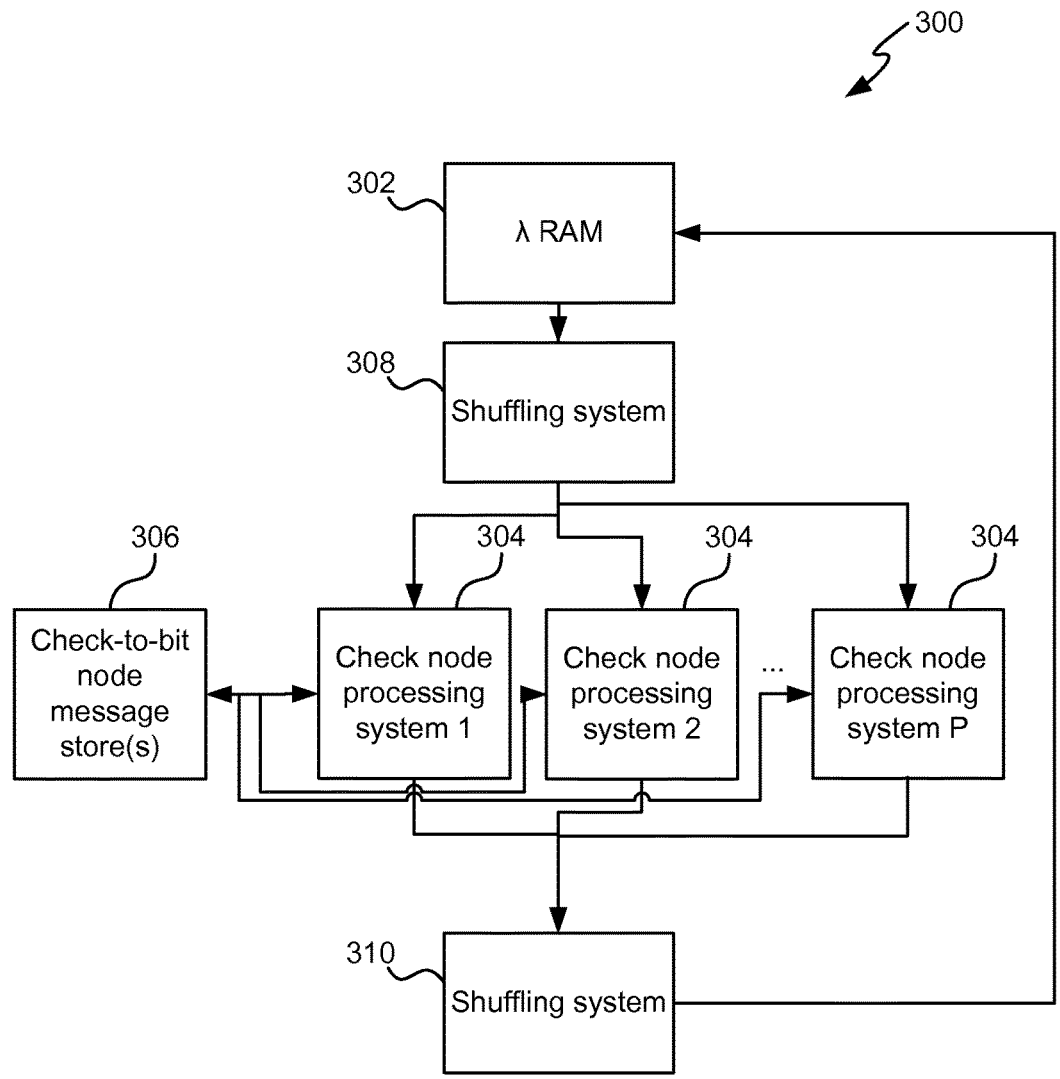
FIG. 3 is a schematic diagram showing an example LDPC decoder.

FIG. 3 is a schematic diagram showing an example LDPC decoder 300. It comprises one or more memories which form the λ RAM 302 which is arranged to store the estimated LLRs for each bit node (which may be referred to as soft decisions or 'bit node values'). These values may be denoted $Q_j[k]$ where j identifies the bit node and k is the iteration number. The LDPC decoder 300 further comprises a plurality of check node processing systems (or check node processing blocks) 304 which operate in parallel. Each check node processing system 304 interfaces to a check-to-bit node message store 306 and this store may be provided by one or more memories (e.g. there may be one memory per check node processing system 304). These check-to-bit node messages may be denoted $R_{ij}[k]$ where i identifies the check node. The LPDC decoder 300 additionally comprises two shuffling systems 308, 310 which obtain the appropriate bit node data for processing from the λ RAM 302 and pass it to the check node processing systems 304 and then return the updated bit node data to the appropriate points in the λ RAM 302.

The decoder 300 shown in FIG. 3 comprises P check node processing systems 304 (where P is an integer) and therefore the decoder can process a maximum of P check nodes in parallel. The group of check nodes that are processed in parallel may be referred to as a check node block (CNB) and examples of CNBs 402 can be seen in the example fragment of an H-matrix 400 in FIG. 4. A CNB comprises $P_{CNB}$ check nodes and in the example of FIG. 4, $P_{CNB}=3$. In an example implementation which utilizes all the check node processing systems 304, $P=P_{CNB}$ (for a particular LDPC code), although as described below, in some examples $P>P_{CNB}$ (due to the difference in sub-matrix sizes of various codes supported by the LDPC decoder). By increasing the size of the CNB (i.e. by increasing $P_{CNB}$), the throughput is increased; however the hardware size is increased (as a result of the additional check node processing systems 304, i.e. as P increases). In an example, the number of check nodes in a layer may be an integer multiple of the CNB size, so that an integer number of CNBs comprise a layer (e.g. as in FIG. 4 where there are 9 check nodes in a layer and 3 check nodes in a CNB). In an example, for DVB-T2, a decoder may use 8 CNBs per layer, with a CNB size of 45 (i.e. $P_{CNB}=45$), or by running the decoder at an elevated internal clock frequency, the CNB size may be reduced.

Figure 4:
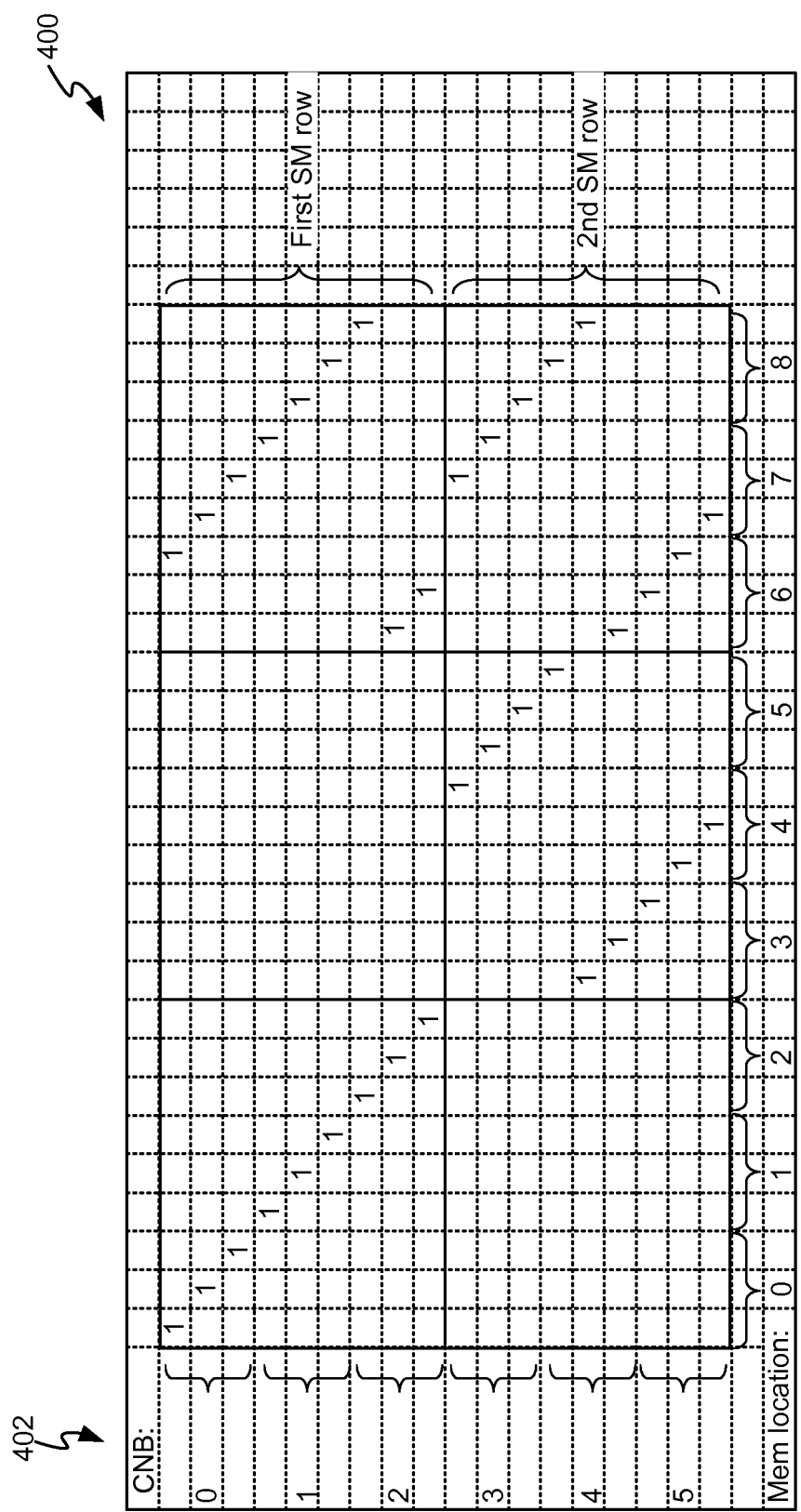
FIG. 4 shows an example fragment of a parity check matrix.

The shuffling system 308 is arranged to present the correct bit node data at the check node processing systems 304. Fetching the data for a CNB (as is required by the check node processing systems 304) involves picking out sets of soft decision data (i.e. sets of $Q_j[k]$ values) from the λ RAM 302, one CNB in length (i.e. $P_{CNB}$ values per clock cycle). Although the H-matrix can be arranged as a set of sub-matrices, with each sub-matrix comprising a null matrix or one or more single cyclically shifted identity matrices (e.g. as shown in FIG. 4), the cyclical shifting of the identity matrices means that the sets of data which are required from the λ RAM 302 may start at pseudo-randomly arranged starting points. When the sub-matrix size is equal to P or is equal to P*N (where N is an integer), then the starting points will be regular and the shuffling required (by shuffling system 308) is less complex. However, when the sub-matrix size is not equal to P*N then the starting points will be irregular and the shuffling system performs more complex operations. For example, where the sets of data start at pseudo-randomly arranged starting points and although in contiguous order, they will wrap around the sub-matrix boundaries. This is shown in CNB 2 in the right hand sub-matrix of the example fragment of an H-matrix 400 shown in FIG. 4.

Processing a check node requires $r_i$ bit node values (where $r_i$ is the number of bit nodes connected to check node i) and in the example shown in FIG. 4, each non-null sub-matrix contributes one bit node value to each check node. The value of $r_i$ is the same for all check nodes in a CNB and is equal to the number of sub-matrices from which the bit node data needs to be supplied.

If each check node processing system 304 has a single q-bit input and a single q-bit output (where q is the word width of the bit node LLR data, $Q_j[k]$), the connected bit node data is passed into each check node processing system in serial fashion and maximum throughput is achieved when the decoder 300 processes P check nodes in $r_i$ clock cycles. To match this throughput at the input and output of the λ RAM 302, the λ RAM 302 requires a total RAM width of P*q bits (for a dual-port RAM); however, if the total RAM width is exactly equal to P*q bits (for a dual-port RAM), the reordering system implemented within the shuffling systems 308, 310 in order to present the data in the correct order (to the check node processing systems 304 and λ RAM 302) is complex and this leads to significant latency. In addition, where the diagonal (in a cyclically shifted identity matrix) is not aligned to memory location boundaries, data which is pulled out in one cycle (i.e. for one CNB) needs to be stored for use in processing a subsequent CNB and this can be described with reference to FIG. 4.

In the example fragment of an H-matrix 400 shown in FIG. 4, the sub-matrix size, S (where S is an integer) is an integer multiple of the size of a CNB, $P_{CNB}$. In the example shown, $P_{CNB}=3$ and S=9, i.e. there are 3 CNBs in a sub-matrix, and the memory width is 3 bit nodes (i.e. 3q, which is exactly equal to $P_{CNB}*q$). Referring back to FIG. 3, the corresponding decoder comprises three check node processing systems 304 ($P=3=P_{CNB}$). In the example shown in FIG. 4 there is also only one identity matrix per sub-matrix, although the methods described herein may be applied to codes where there is more than one identity matrix per sub-matrix, as described below with reference to FIG. 13.

To process CNB 0, all the data required for the left-hand sub-matrix can be obtained by accessing memory location 0 (e.g. in a first cycle, with one bit node value being passed to each of the three check node processing systems 304); however, to access the data for the right-hand sub-matrix (with the central sub-matrix being a null matrix and so being ignored for CNBs 0-2), memory locations 6 and 7 are accessed (which takes two cycles). In accessing these two memory locations, more data is obtained than is needed to process CNB 0 and this additional data is required for processing CNBs 1 and 2. As the total RAM width equals $P_{CNB}*q$ ($P=P_{CNB}$ in this example), there is no available RAM throughput to access the same data again (when processing CNB 1 or 2) and so this additional data needs to be retained. Retaining this data is problematic because it introduces latency (i.e. it introduces a period of time during which the data is cached outside of the λ RAM and during which time a new sub-matrix row cannot be processed in case the same bit nodes feed into a non-null sub-matrix in the next row). This causes difficulties in ensuring updates are processed in the correct order, and requires additional storage, e.g. in the form of caches for the additional data.

Figure 7:
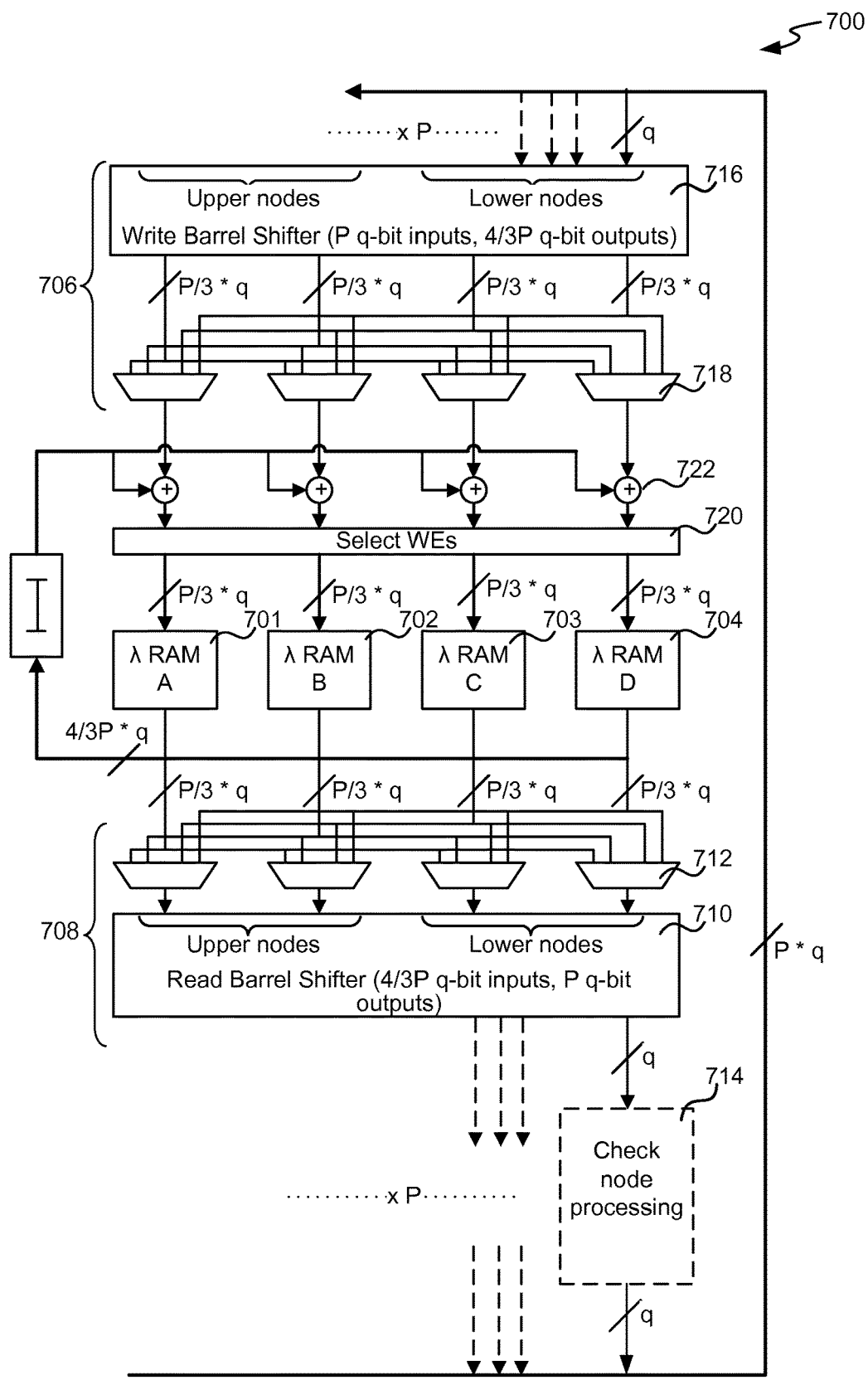
FIG. 7 shows a schematic diagram of another example decoder.
Figure 9:
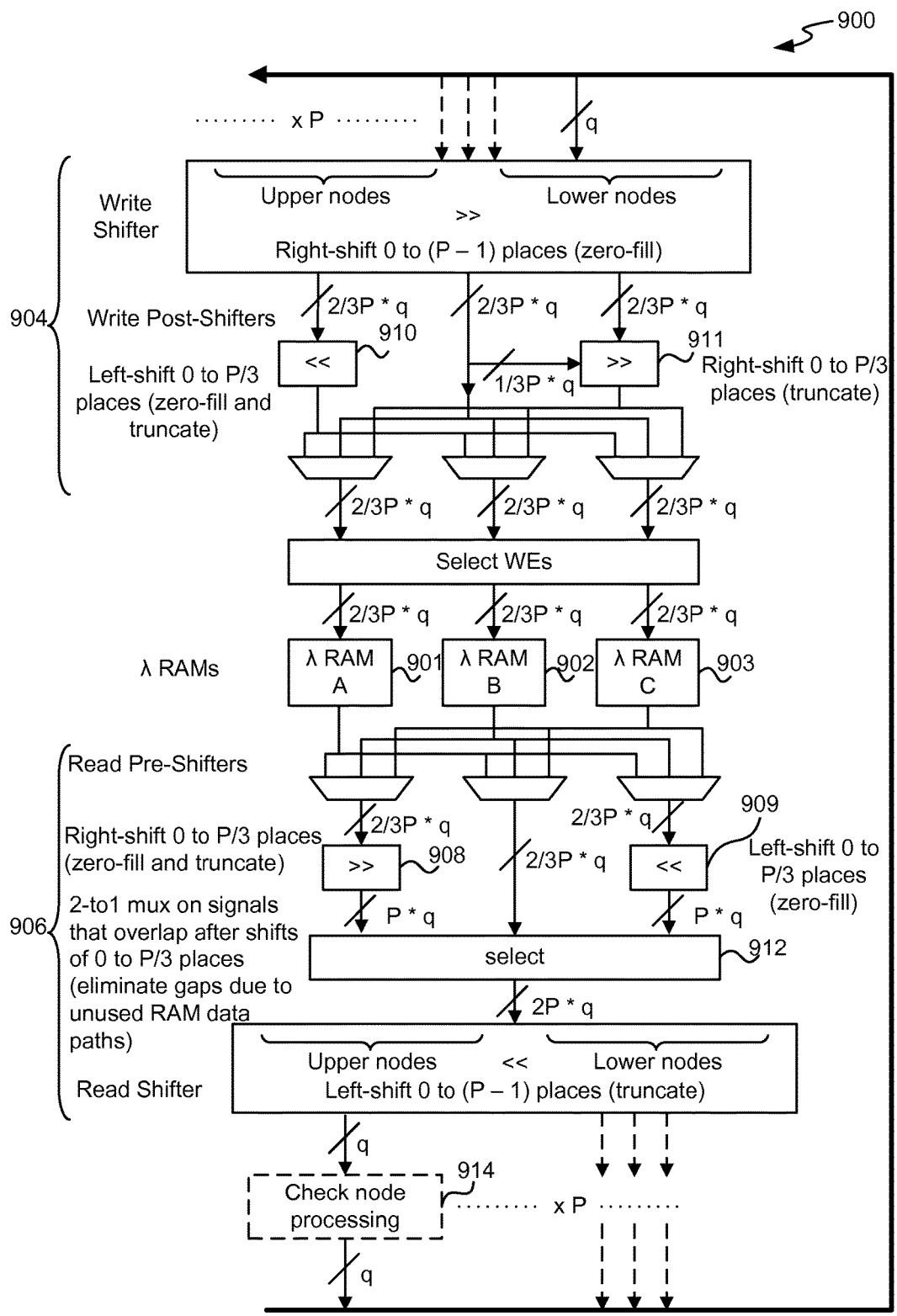
FIG. 9 shows a schematic diagram of a further example decoder.

Described herein is an improved LDPC decoder (or decoder architecture) which is configurable, in that it supports many different LDPC codes and these supported LDPC codes may have any size of sub-matrix. Furthermore in the improved LDPC decoder the total memory width (i.e. the amount of data which can be accessed from the overall λ RAM 302 in a single cycle) is wider than P*q, which enables a complete CNBs worth of data to be accessed in a single cycle (e.g. in a single access to a memory) per sub-matrix, irrespective of where the diagonal is placed within the sub-matrix and without any need to store unwanted data for later use. The λ RAM 302 may comprise multiple independently addressable memories (i.e. M independently addressable memories, where M is an integer). In various examples the M memories may comprise one or more additional banks of memories compared to the baseline requirement of a width of P*q (e.g. as shown in FIG. 7) and/or wider banks of memories (e.g. as shown in FIG. 9). In many examples, the M banks of memories may all have the same width; however, in other examples, the memories may have different widths (e.g. 4 larger width memories and 2 smaller width memories, with M=6).

In an example, which may be used for DVB-T2, $P_{CNB}$=45=P and the λ RAM 302 may comprise banks of memories which are each 15 soft-decisions wide (e.g. each have a width of 15q). In this example, 3 memories would match P (and may be denoted the baseline memory requirement); however, in an example improved decoder there may be 4 memories. In a second example, 3 wider memories may be used with each memory having a width of ⅔*P*q (instead of ⅓*P*q which is the baseline requirement).

Where P=$P_{CNB}$ the baseline memory requirement may be denoted P*q or $P_{CNB}$*q. Where P>$P_{CNB}$, however, the baseline memory requirement for the particular code is $P_{CNB}$*q and the baseline memory requirement for the decoder (which may be a multi-code capable decoder) is P*q (as it is determined by the number of check node processing systems and not the actual size of the CNB used for any code). Where the baseline requirement (P*q) is satisfied by $M_{min}$ memories, each of width P/$M_{min}$*q, there may be more than $M_{min}$ memories (i.e. M>$M_{min}$) and/or each memory may have a width which exceeds P/$M_{min}$*q.

Figure 5:
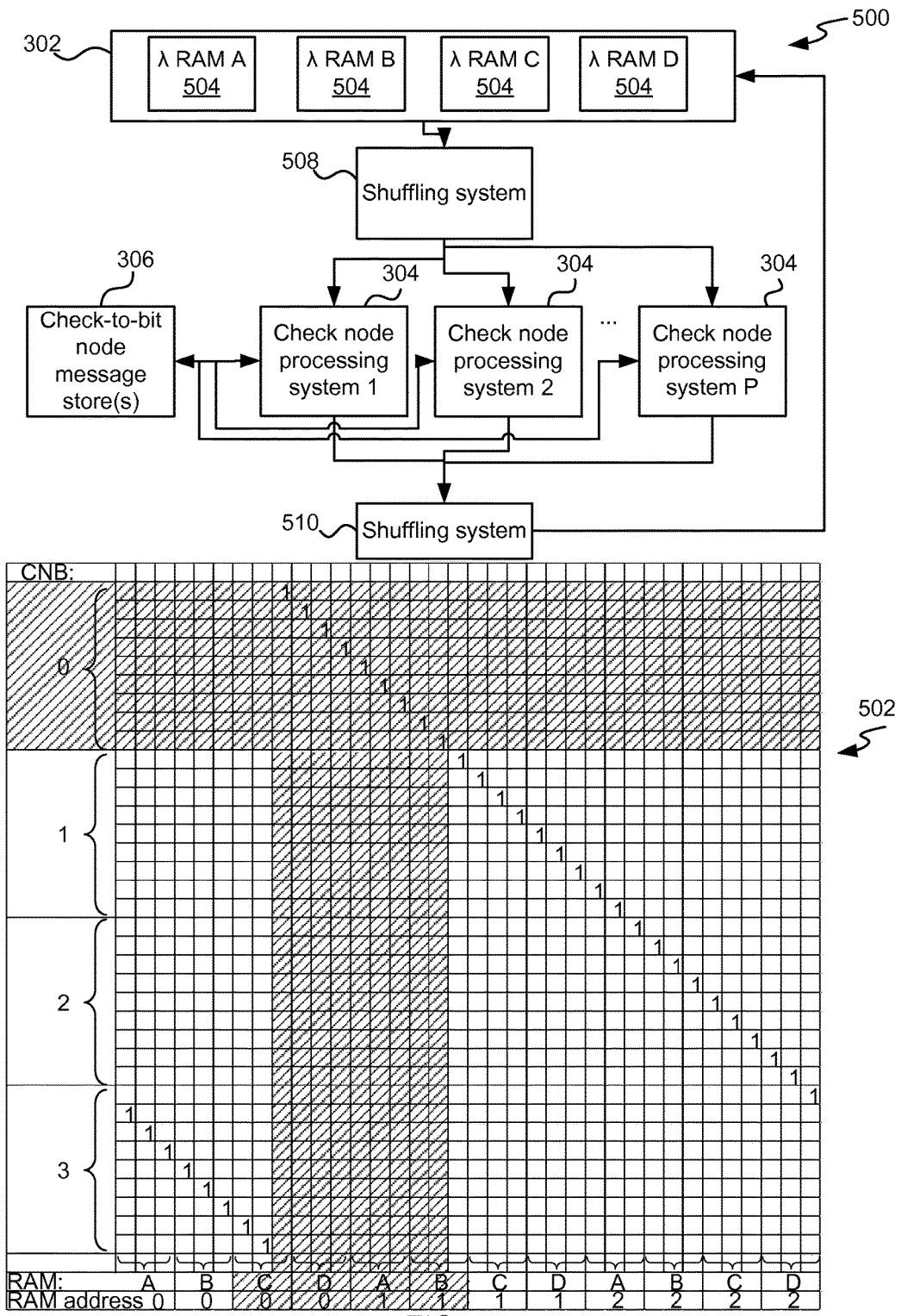
FIG. 5 shows a schematic diagram of an example decoder and a fragment of an H-matrix comprising a single sub-matrix.

FIG. 5 shows a schematic diagram of an example configurable LDPC decoder 500 which supports many different LDPC codes (having any size of sub-matrix) and a fragment of an H-matrix comprising a single sub-matrix 502, where the sub-matrix size is 36. In this example, P=$P_{CNB}$=9 (so there are 9 check node processing systems 304, and $P_{CNB}$ is an integer sub-multiple of the sub-matrix size) and the λ RAM 302 comprises four memories 504 (labelled A-D). The memory width of each memory is 3 bit node values (i.e. 3q), such that three memories would satisfy the baseline requirement (of P*q); however this system comprises an additional memory (giving a total memory width of 12q=4/3*P*q). It will be appreciated that this arrangement comprising 4 memories is shown by way of example only and in other examples, depending on sub-matrix size, required throughput etc, different numbers of memories may be used. For example, any arrangement of M memories may be used where the total width of M−1 of those M memories can supply at least $P_{CNB}$−1 bit node values, i.e. for M memories, each having a width of w bit node values, (M−1)w≥($P_{CNB}$−1).

Although FIG. 5 shows $P_{CNB}$ as an integer sub-multiple of the sub-matrix size, it will be appreciated that this may not always be possible (e.g. where S is prime).

The decoder 500 further comprises two shuffling systems 508, 510. The first shuffling system 508 is arranged to present the correct bit node data at the check node processing systems 304 and the second shuffling system 510 is arranged to return updated bit node data (e.g. in the form of updates or updated values, as described in more detail below) to the λ RAM 504.

The operation of extracting bit node data from the sub-matrix 502 is shown for CNB 0 by the shading in FIG. 5 and this operation is implemented by the first shuffling system 508. As shown in FIG. 5, all the required bit node values are obtained by accessing RAM C location 0, RAM D location 0, RAM A location 1 and RAM B location 1 and all these values can be accessed in a single cycle (because there is only a single location from each memory which is accessed). Two bit node values are then discarded from the data accessed from RAM C and one bit node value is discarded from the data accessed from RAM B. The number of memory locations which can contribute to each CNB is dependent upon the architecture design.

Figure 6:
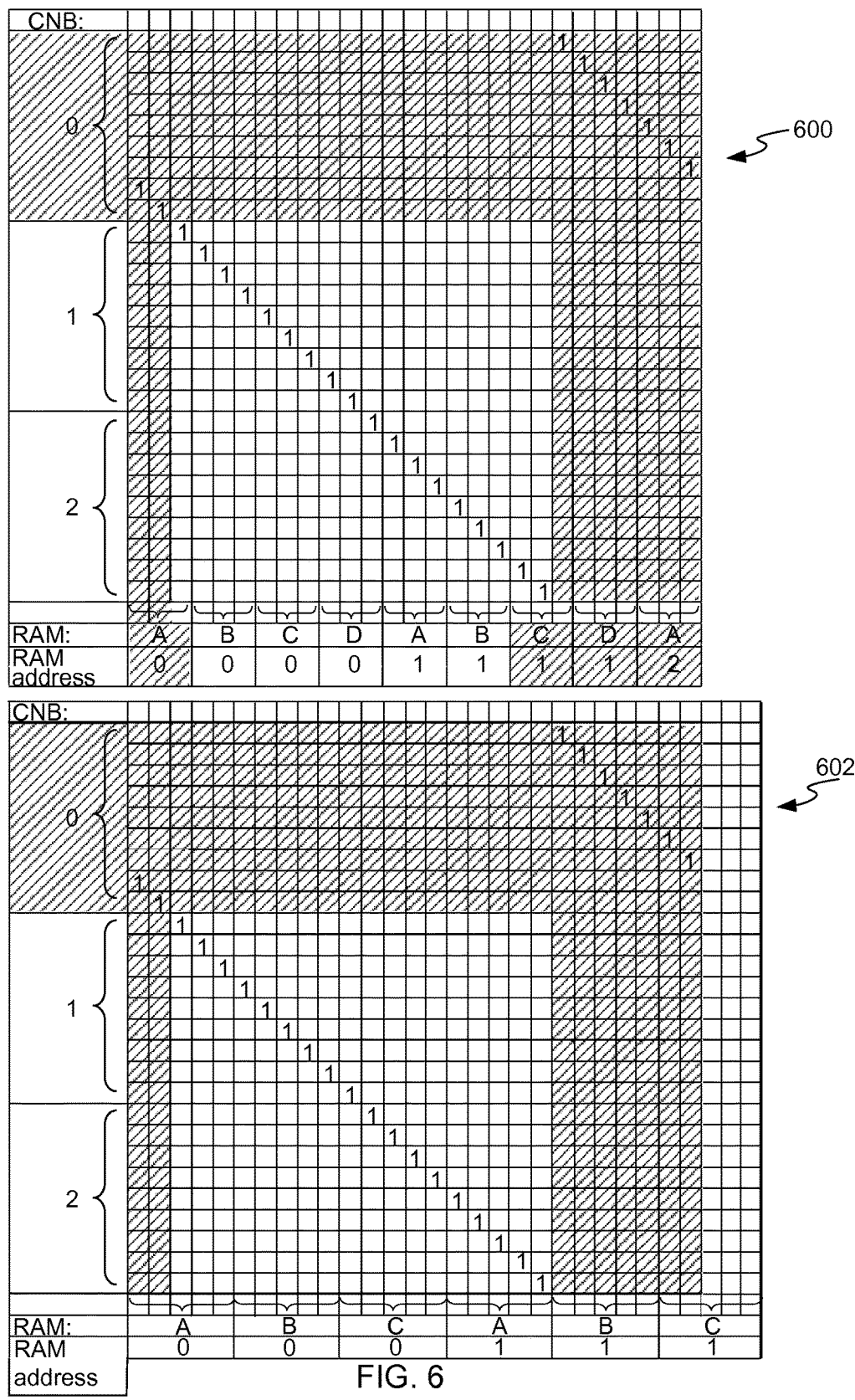
FIG. 6 shows two example sub-matrices.

FIG. 6 shows a first example sub-matrix 600 which is similar to that shown in FIG. 5 in that it corresponds to the four memory arrangement (M=4) with 3 soft decisions per memory location; however in this example sub-matrix 600 there are only 3 CNBs per sub-matrix, so the sub-matrix size is 27 (compared to S=36 in FIG. 5 with 4 CNBs per sub-matrix). This means that in sub-matrix 600 there are 9 memory locations which contribute to the sub-matrix: this is the first sub-matrix in a row, so these comprise locations 0 and 1 from each memory and additionally location 2 from RAM A.

As can be seen in this example, processing CNB 0 in sub-matrix 600 would require pulling data from 2 locations in memory A (A0 and A2) while memory B remains unused; so this is not possible.

In contrast, in the second example sub-matrix 602 in FIG. 6, any RAM location (or RAM address), when applied across all RAMs (e.g. location x from each of RAMs 1 to M), accesses data from only one sub-matrix and this avoids the problems described above with reference to sub-matrix 600. In the second example, there are 3 RAMs (M=3) and each memory location is 5 soft decisions wide. Each RAM supplies two locations per sub-matrix and the six locations provide a memory width of 30 bit nodes. This results in 3 wasted bit nodes (in memory location C1 in this example); however, it enables a cyclic selection of memories when wrapping around the sub-matrix boundary (i.e. in order that it is not necessary to read from two locations in the same memory for a single CNB). In examples like this where there are unused RAM data pathways, gap closing hardware may be used and this is described below with reference to FIG. 9.

The GB20600 code (which is an example of a LDPC code used for digital terrestrial television) uses a sub-matrix size of 127, which is a prime number. If hardware is implemented which is capable of processing 45 check nodes in parallel (P=45, because this is an optimal arrangement for another code), then an efficient split into CNBs for the GB20600 code would be 3 CNBs per sub matrix, of size 42, 42 and 43, as this would efficiently use the available check node processing systems. With a four memory arrangement, as described above and which may be optimal for other codes (e.g. DVB-T2), and a memory location width of 15 soft decisions, this gives 9 RAM locations per sub-matrix (9 memory widths gives 135 soft decisions). In this arrangement, however, any RAM location, when applied across all RAMs (e.g location x in each of RAMs 1 to M), will not access data from only one sub-matrix (as detailed above) and instead there will be some RAM locations, when applied across all RAMs, which access data from more than one sub-matrix. This means that the cyclic selection will break down across sub-matrix boundaries and so is not possible. To use a four memory (M=4) arrangement to process this code, 12 RAM locations per sub-matrix (a multiple of M)

may be used. In other words, a system so-designed would use 4 CNBs per sub-matrix, of size 32 or 31 (3*32+31=127). Each CNB takes data from 3 memory locations and there is a hardware utilisation efficiency of 71% (as 32 of the 45 check node processing systems are used).

With this arrangement of 4 memories (M=4), different sub-matrix sizes can result in very different hardware utilisation. For example, with the sub-matrix size, S=60 4 RAM locations can be used per sub-matrix and hence fully utilise the 15 RAM data paths. With 2 CNBs per sub-matrix there are 30 check node processing systems used (out of the total of 45 check node processing systems), for an efficiency of 67%. However, for S=61 8 RAM locations need to be used per sub-matrix, hence 7 or 8 RAM locations actually used in each RAM. This means using a CNB size of 20 or 21, (with 3 CNBs per sub-matrix) which drops the efficiency to 45%. Consequently, depending on the sub-matrix size, the four memory arrangement may not be optimum and an alternative arrangement is described below with reference to FIG. 9.

As described above, to avoid problems associated with having to access two memory locations from the same RAM, any RAM location (or RAM address), when applied across all RAMs, accesses data from only one sub-matrix, i.e. location x from each of RAMs 1 to M accesses the same sub-matrix. The number of memory locations in a sub-matrix is therefore a multiple of the number of utilized independently addressable memories (M) that together form the λ RAM.

FIG. 7 is a schematic diagram of another example configurable LDPC decoder 700 which supports many LDPC different codes (having any size of sub-matrix) in which the total memory width exceeds the baseline value of P*q. As with the example in FIG. 5, the example in FIG. 7 comprises four memories 701-704 and has a total memory width of 4/3*P*q.

As in the example of FIG. 5, the decoder 700 comprises two shuffling systems 706, 708. The shuffling system 708 at the output of the λ RAM 701-704 comprises a Read Barrel Shifter 710 and a plurality of interconnected multiplexers 712. The read data from the RAMs 701-704 is applied to the Read Barrel Shifter 710, which deals with the fact that the start of each diagonal within the H-matrix may not be aligned to the memory width. Thus the barrel shifter 710 takes in 4P/3 soft decisions from the RAMs 701-704 and outputs the required P soft decisions, aligning the bit nodes with their requisite check nodes, and discarding the unwanted P/3 soft decisions in the process. The set of multiplexers 712 on the input to the barrel shifter 710 re-order the RAM output to deal with the fact that the memory containing the higher check nodes will change according to the position of the diagonal and to provide the bit nodes to the barrel shifter 710 in a consistent order (e.g. highest check nodes on the left, lowest check nodes on the right in the example shown).

Processing of a single CNB consists of reading out the bit node data from each non-null sub-matrix in turn (from λ RAM 701-704) and flowing it through the barrel shifter 710 into the check node processing systems 714. Updates for the bit data then flow out of the check node processing systems (or systems) 714, in the same order, entering a Write Barrel Shifter 716 (which is part of the second shuffling system 706). This barrel shifter 716 performs the opposite function to the Read Barrel Shifter 710, re-aligning the data with the required position in the RAMs 701-704. A set of multiplexers 718 then direct the correct values into each RAM. Since the RAMs 701-704 take 4P/3 input values while only P values arrive from the check node processing systems 714, some values will be invalid; and these are masked from being written by a set of write enable controls 720.

It will be appreciated that the operation of the read and write barrel shifters referred to herein (e.g. Read Barrel Shifter 710 and Write Barrel Shifter 716) is distinct from conventional barrel shifters which may be used in a conventional LDPC decoder. A conventional barrel shifter is configured for a specific size of code sub-matrix and simply performs a cyclic rotation of the input elements and then outputs those cyclically rotated input elements (i.e. the same number of elements are output as are input). As described above, however, the barrel shifters implemented in the configurable LDPC decoders described herein input and output different numbers of elements (e.g. according to the precise RAM arrangement, LDPC code structure, etc).

Figure 8:
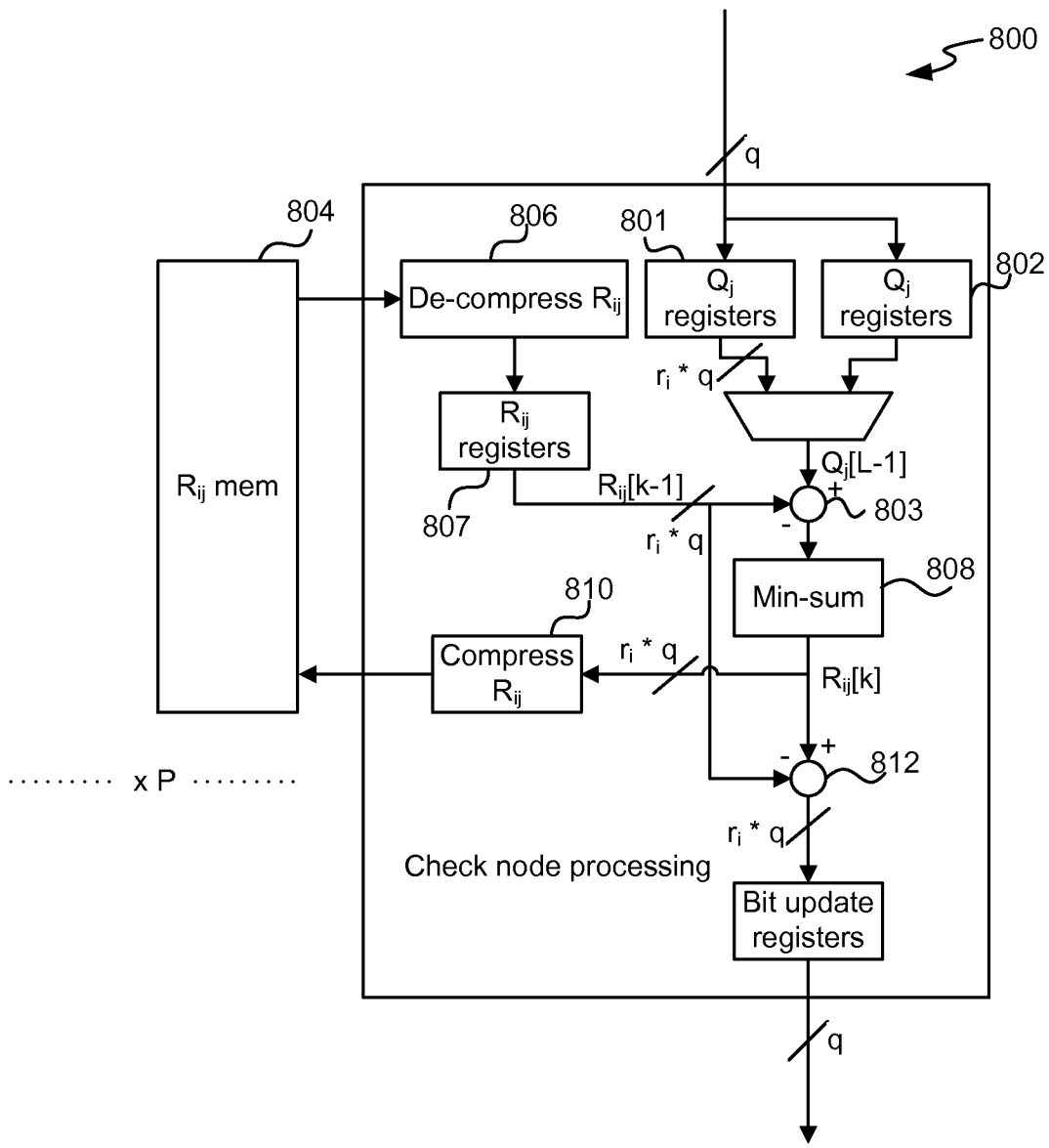
FIG. 8 shows a schematic diagram of an example check node processing system.

FIG. 8 shows a schematic diagram of an example check node processing system 800. Each check node processing system receives one piece of bit node data, $Q_j[L-1]$ per clock cycle, (where L is the layer index, for layered decoding) so it takes $r_i$ clock cycles to accumulate sufficient data to proceed with the calculation. For this reason, the $Q_j$ registers 801-802 at the input to the check node processing system 800 are double-buffered: while data for one check node is entering, the data for the previous check node is being processed.

The first stage of check node processing is to subtract the stored check-to-bit node messages from the last iteration, $R_{ij}[k-1]$, from the $Q_j[L-1]$ values (block 803). In some examples, the $R_{ij}[k-1]$ values may be stored in "compressed" form (e.g. minimum, index of minimum, a set of sign bits and the minimum-but-one value) in store 804. This data is "de-compressed" in double-buffered fashion (in blocks 806-807) such that the de-compressed $R_{ij}[k-1]$ values appear co-incident with the corresponding $Q_j[L-1]$ values (at block 803).

The new set of check-to-bit node messages $R_{ij}[k]$ may then be calculated (in block 808) using:

$$R_{ij}[k] = \delta_{ij} \cdot \underset{j' \in R[i]\setminus\{j\}}{\text{MIN}} (|Q_{j'}[L-1] - R_{ij'}[k-1]|) \tag{1}$$

where $\delta_{ij}$ is a sign correction factor determined by the XOR function of signs (see equation (4) below) and the expression $j' \in R[i]\setminus\{j\}$ indicates that index j' runs across the set of connected bit nodes, but skipping the current index j. The new check-to-bit node messages are re-stored (in store 804) in compressed form (where the compression is performed in block 810) ready for the next iteration.

The following equation may then be used to update the bit node values:

$$Q_j[L] = Q_j[L-1] - R_{ij}[k-1] + R_{ij}[k] \tag{2}$$

However, in the example shown in FIG. 8, the value emerging from the check node processing block 800 is just the $-R_{ij}[k-1]+R_{ij}[k]$ part (as generated in block 812) and the addition to $Q_j[L-1]$ is done by adders 722 situated before storage back to the RAMs 701-704 (as shown in FIG. 7).

Equations (1) and (2) above are described in more detail below.

FIG. 9 is a schematic diagram of a further example configurable LDPC decoder 900 which supports many different LDPC codes (having any sub-matrix size) and in which the total memory width exceeds the baseline value of P*q. In this example there are three λ RAMs 901-903 (M=3) which each have a memory width of 2/3*P*q, giving a total width of 2P*q. The architecture shown in FIG. 9 is very flexible and can accommodate many different sub-matrix sizes (e.g. ranging from small sub-matrix sizes for some wireless standards to significantly larger sub-matrix sizes for digital television standards) and hence many different codes.

In this example, the implementation of the shuffling systems 904, 906 is slightly different to that shown in FIG. 7 and described above, although it will be appreciated that either decoder 700, 900 may use any suitable architecture to implement the shuffling systems. In the example of FIG. 9, the read pre-shifters 908-909 and write post-shifters 910-911 operate to close any gaps caused by unused data paths in the RAMs. By introducing this gap filling hardware into the architecture, the number of soft decisions (i.e. bit node values) that can emerge from each memory location is a variable which can be selected for a particular application.

In a standard where all data paths in the RAMs are used (i.e. for sub-matrix sizes where all data paths in the RAMs are used, $P=P_{CNB}$), the pre- and post-shifter values stay on 0 and these stages have no effect. This is the case, for example, in DVB-T2 with $P_{CNB}=36$. For this code a sub-matrix size of 360 may be used, which can be divided into 10 CNBs in order to 100% utilise the 36 check node processing systems which may be provided within an example decoder (with S=360, P=36). With 24 soft decisions per RAM location (as the memory width is $\frac{2}{3}$*P*q and $\frac{2}{3}$*36=24), there are 15 RAM locations per sub-matrix, which is a multiple of 3 as is required with a 3-RAM system (for the reasons described above with reference to FIG. 6).

For the case of GB20600 (a different digital television standard), running on the same hardware, S=127 and only 6 RAM locations make up the sub-matrix (6 being the smallest multiple of 3 that results in ≤24 soft decisions used per RAM location); so only 21 or 22 soft decisions are actually from each RAM location, given the sub-matrix size of 127. With 36 data paths available (P=36), the maximum CNB size that can be used is 36 and 4 CNBs per sub-matrix may be used, so the actual CNB size, $P_{CNB}$, is 31 or 32; making for a 88% utilisation figure (where this is given by $P_{CNB}/P$).

As demonstrated by this example, for improved efficiency, $P_{CNB}$ (the CNB size) should be close to P, as this means that the check node processing hardware is not under-utilised, subject to the constraints that the number of RAM locations making up a sub-matrix is a multiple of the number of independently addressable memories and the number of soft decisions per location does not exceed the width of an individual memory.

Figure 10:
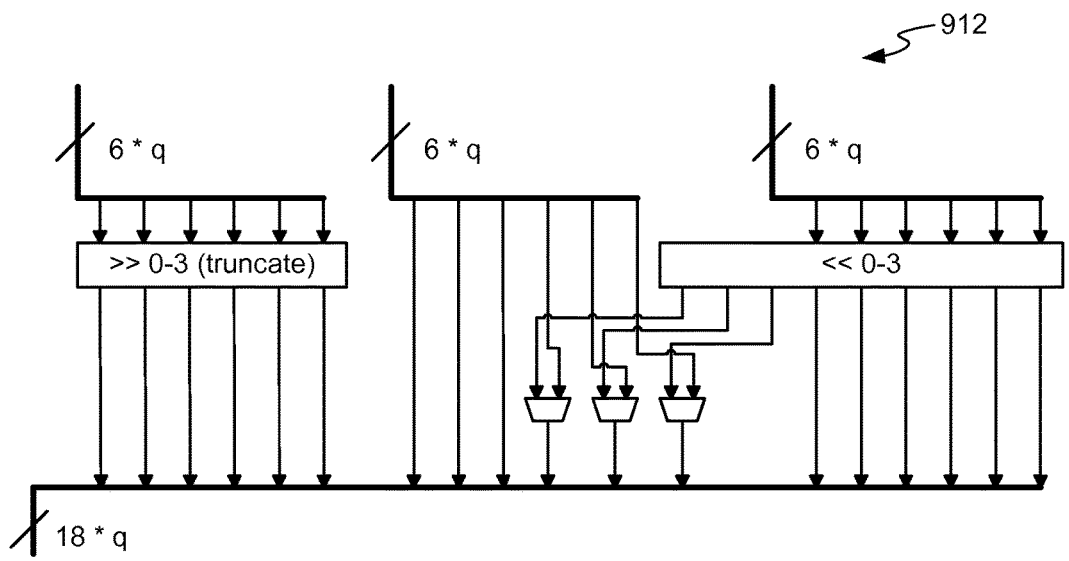
FIG. 10 shows a schematic diagram of the select block from the decoder shown in FIG. 9.

The read pre-shifters 908-909 shift the data from the "outlying" memory locations inwards towards the centre, enabling the creation of "overlaps" where there are unused data paths. The select block 912 following these pre-shifters 908-909 then consists of 2-to-1 multiplexers to select the appropriate lines where an overlap has been created, i.e. in areas of overlap between unwanted data from one memory and wanted data from a second memory, the select block will select the second memory. FIG. 10 shows a schematic diagram of the select block 912, simplified for the case of P=12; and FIG. 11 shows an example of how the data for a particular CNB is assembled for the GB20600 case.

Figure 11:
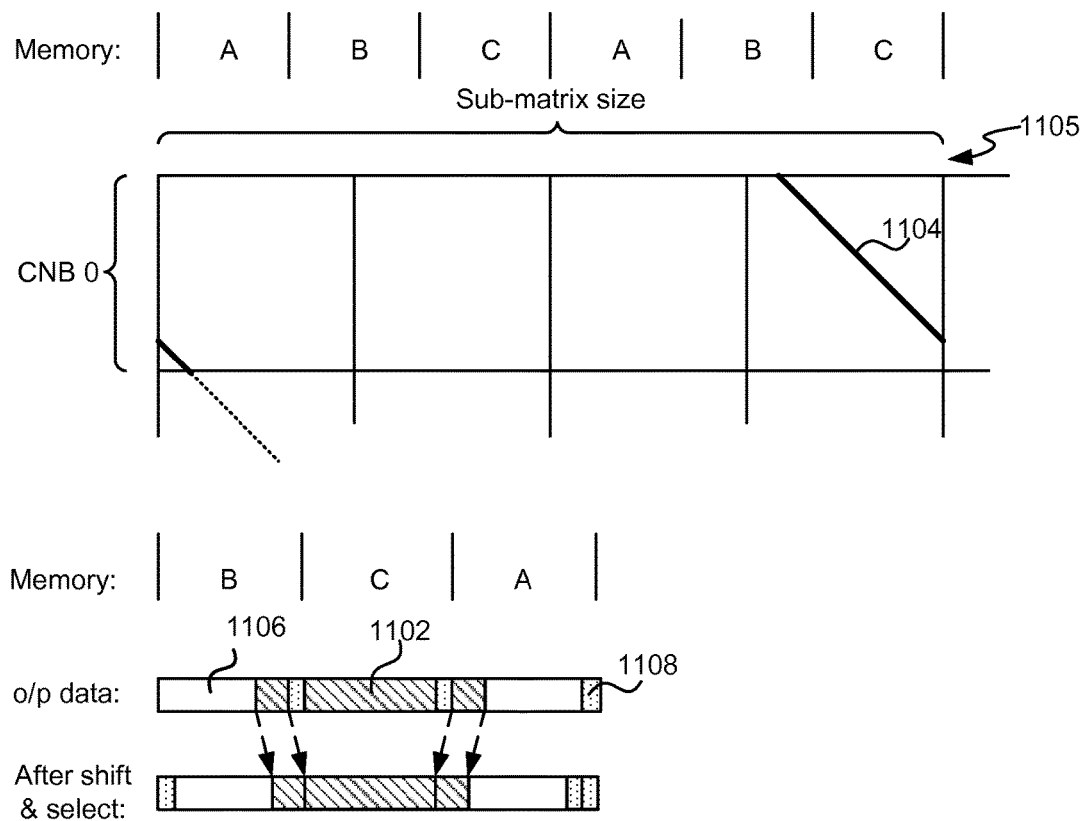
FIG. 11 is a schematic diagram showing an example of how the data for a particular check node block is assembled for a particular code.

In FIG. 11, the wanted data 1102 is shown with diagonal shading and this corresponds to the bold diagonal 1104 shown within CNB 0 (in the H-matrix fragment 1105). Unwanted data 1106 is shown without any shading, and data coming from unused RAM data paths 1108 is shown as a dotted pattern. It will be appreciated that both the CNB size and the number of RAM data paths used may vary according to position in the H-matrix.

In this example, the unused data is located in the "right hand" memory data paths (i.e. the data paths with highest bit node index). This gives rise to "asymmetry" in the shift/select design (e.g. in FIG. 9 or 10). The output from memory B is right-shifted to lose the unused paths; however the data in this region always comes from memory B (i.e. it is shifted into a position previously occupied by data also from memory B) so there is no need for selectors. The output from memory A is left-shifted to overlap with the unused region of memory C, and the select block selects memory A in this region. Thus the unwanted gaps are closed.

The gap closing hardware shown in FIGS. 9-11 and described above, enables a system to effectively change the width of a RAM to cope with different sub-matrix sizes (by allowing the system to ensure that data divides into the sub-matrix size). Where there is more than one gap which is closed, the sizes of the different gaps do not have to be the same.

The example decoder shown in FIG. 9 does not comprise any adders (e.g. corresponding to adders 722 in FIG. 7). In this case the addition of $-R_{ij}[k-1]+R_{ij}[k]$ to $Q_j[L-1]$ is performed within the check node processing systems 914 and FIG. 12 shows a schematic diagram of an example of such a check node processing system 1200.

Figure 12:
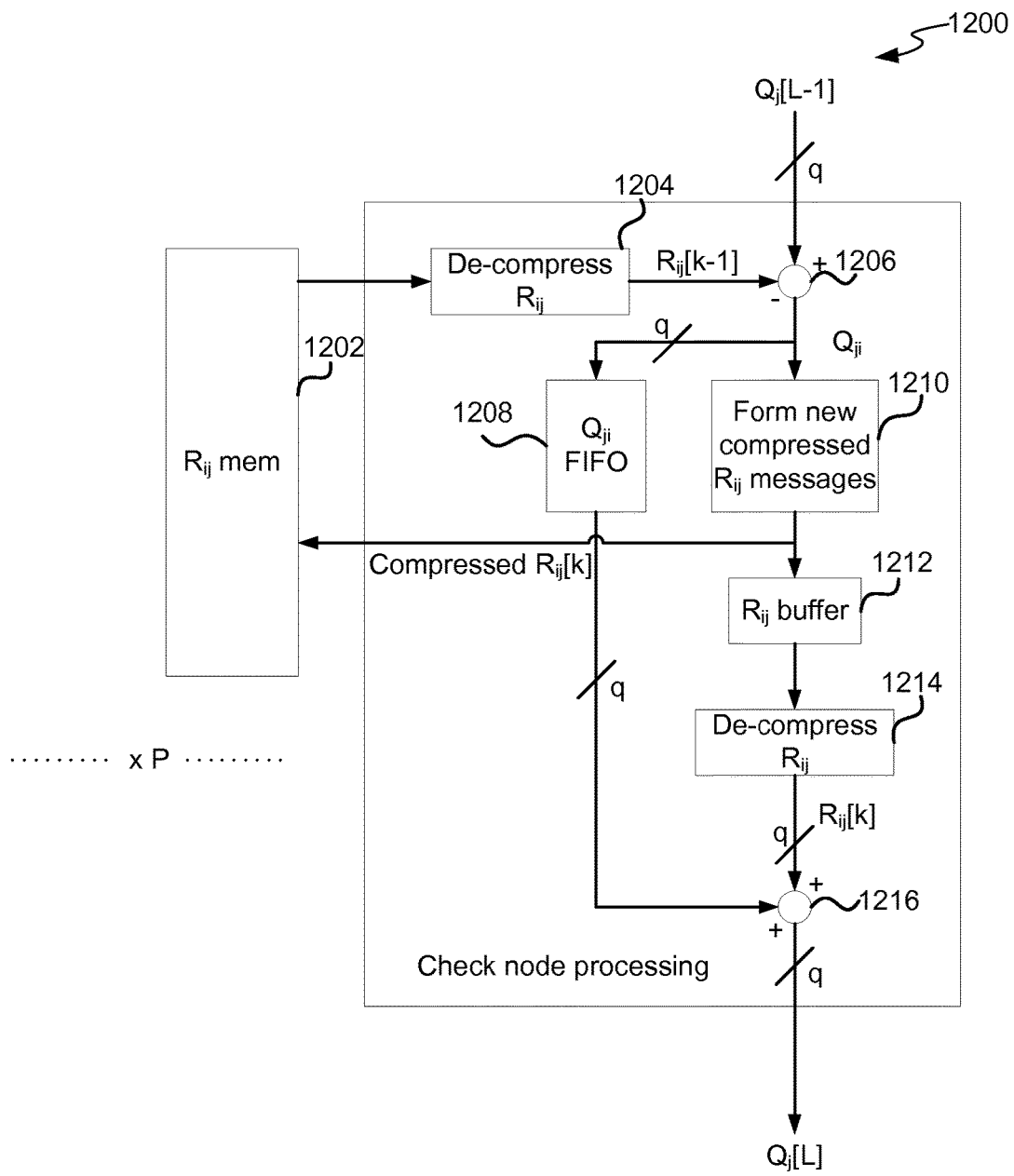
FIG. 12 shows a schematic diagram of another example check node processing system.

In the example check node processing system 1200 shown in FIG. 12, the $R_{ij}$ messages from this check node on the previous iteration are retrieved in advance from the $R_{ij}$ RAM 1202; these are then de-compressed (in block 1204) and subtracted from the $Q_j$ values (in block 1206) as they enter the check node processing system 1200, forming the $Q_{ji}$ bit-to-check node messages. As these enter, the system records their signs, and keeps a running estimate of the minimum and next-minimum magnitudes. The $Q_{ji}$ messages are also stored in a FIFO 1208. Once the last bit node values for a particular CNB have entered, each check node processing system can then form a new compressed set of $R_{ij}$ messages (in block 1210) for storage. These messages are stored in a small buffer 1212; and on output from this buffer they can be decompressed (in block 1214) and added to the $Q_{ji}$ messages emerging from the FIFO 1208 (in block 1216), forming the new $Q_j$ values for outputting back to the λ RAMs.

In a variation of the LDPC decoder 900 shown in FIGS. 9-12, the two levels of shifting (i.e. the shifters and pre-shifters) shown for both read and write may be combined into a single shifting stage for each of reading and writing. In an example, the shifting stage may apply a single shift to each of the left, middle and right groups of LLRs with appropriate masking and then logically Ors them together. This is functionally equivalent to the two stage approach shown in FIGS. 9-12 and it will be appreciated that there may be other variations in shifting strategy which are also functionally equivalent.

The architectures shown in FIGS. 9-12 are designed to operate with multiple different codes and as a result the architecture of the check node processing system 1200 is slightly different to that shown in FIG. 8 and described above. If every check node for a particular code had an identical number of connected bit nodes, then the $Q_j$ buffer can be structured as a double-buffer system (as in the example in FIG. 8): one buffer being used to accumulate the messages for the current check node, while the other buffer is reading out the messages for the previous check, forming the modified $Q_j$ output. However, in implementations where there may not be a constant number of connected bit nodes per check node (for example for some DVB-T2 codes this quantity varies from one layer to the next), use of such a double-buffer arrangement would result in the operation stalling and losing processing cycles (for example, if the number of bit nodes to be read out is more than the number read in, the operation of the check node processing system is stalled to wait for the read-out to finish).

To avoid stalling in this way, the compressed $R_{ij}$ buffer 1212 in the implementation of FIG. 12 is a very small FIFO with 3 locations. If $r_{MAX}$ is the largest number of bit nodes per check node in the code, then at "start of day" (start of an iteration) the reading out of the check nodes is delayed for $r_{MAX}$ cycles. This means that when the system first starts reading out, the $Q_{ji}$ FIFO 1208 holds $r_{MAX}$ entries; and the system writes to either the 2nd or 3rd location in the $R_{ij}$ buffer 1212 (depending on whether the very first CNB had less than or equal to $r_{MAX}$ connections). This then gives sufficient buffering to ensure that neither the read-out nor the processing operations need to stall from then on.

Although the example LDPC decoder 900 shown in FIG. 9 comprises 3λ RAMs (M=3), in another example there may only be 2λ RAMs (M=2). In such an example, the shifting logic is the same as in a 3λ RAM example except that the same LLRs (from one of the λ RAMs) are used in both the left and right LLR datapaths (e.g. blocks 910-911) such that the shifting logic behaves as a barrel shifter.

In the example codes described above, there is one identity matrix per sub-matrix, although the methods described herein may be applied to codes where there is more than one identity matrix per sub-matrix. An example of such a code is DVB-T2 or DVB-S2 and these codes are not architecture aware. However, these codes do have structure and the H-matrices may be re-arranged to take the form of sub-matrices of size 360×360 nodes containing cyclically shifted identity matrices (with the exception of one parity bit which does not fit the pattern).

Because these codes are not "architecture aware", each sub-matrix may either be null or may contain one or more shifted identity matrices. Where more than one identity matrix is present this may be referred to as a "multi-diagonal" and in some examples, up to 4 identity matrices may be present in a single sub-matrix.

These multi-diagonals make it impossible to divide up the H-matrix into true layers. In a multi-diagonal sub-matrix, the same set of bit nodes will be used multiple times, connected to different check nodes. In many situations, multiple check nodes within a sub-matrix will be attempting to update the same bit node. This has two implications: firstly, these check nodes will all be using the same input value for each bit node (which means a departure from the idea of layered decoding, where each time a bit node is used it has been updated by a previous check node). Secondly, without modification of the architecture described above, it would mean that one of the two updates to the bit node would over-write the other, so one of the updates would get lost.

The first of these implications has the effect that the decoder performance falls somewhere between that of a pure flooding decoder (where all check nodes are fed from the same set of bit nodes) and a true layered decoder (where the bit nodes are updated between each use).

The second of these implications has a more serious consequence: if a check node update is consistently lost, it will degrade the performance of the code. Simulation has shown that some bit nodes will get "stuck", and fail to migrate towards an improved LLR value, if this is allowed to occur. The number of conflicts is reduced through the use of CNBs (as described above) and any remaining conflicts can be addressed by removing those edges (i.e. connections) which conflict within each CNB, as can be explained with reference to the example sub-matrices 1300, 1301 shown in FIG. 13.

In the first example sub-matrix 1300, the two diagonals 1302, 1304 are spaced apart by more than the CNB size, so there are no conflicts between the bit nodes used in any of the CNBs. If the spacing between the diagonals is reduced to less than the CNB size then conflicts will start to appear, as shown in the second example sub-matrix 1301, with maximum conflict arising only when the two diagonals are placed adjacently. Given that in a practical code there is generally a reasonable spacing between diagonals and the methods described herein operate on a CNB rather than a sub-matrix, the number of edges that need to be excluded on any iteration is actually very small. In the second example sub-matrix 1301, the edges that need to be excluded are ringed 1306 and it can be seen that these are only those points where a bit node is involved in two parity checks within the same CNB.

When processing sub-matrices with multi-diagonals, fetching the CNB input data (by the shuffling system) will involve accessing the same sub-matrix twice over (with different start positions for the diagonal in each case). This can potentially put the same bit node data into the processing pipeline twice. When the data arrives back at the RAM (again from a shuffling system), there will be repeated write addresses, which causes updates to be over-written. The values that will be retained, i.e. not over-written, are associated with the addresses which emerge last; and this depends on the order in which the sub-matrices are indexed when reading the data in the first place. By cyclically rotating the order in which the diagonals are referenced when pulling the data out of the λ RAM (by the shuffling system), different updates to be retained for a given layer on different iterations. Referring back to the second example sub-matrix 1301 in FIG. 13, there are two diagonals 1308, 1310. In a first iteration, diagonal 1308 is referenced first, in which case the updates which result from the ringed edges 1306 will be over-written (and so those edges will effectively be excluded from the system). In a second iteration, the other diagonal 1310 is referenced first, and so the updates which result from the ringed edges 1306 will actually over-write the updates resulting from the conflicting edges and so these ringed edges 1306 will be retained.

In an example implementation, this cyclical rotation of the order in which the diagonals are referenced may use a 2D table to record the H-matrix information for each row, as shown below:

| | Order of pulling out from RAM → |
|---|---|
| SM index | |
| Num diagonals | |
| Diag 0 shift | |
| Diag 1 shift | |
| Diag 2 shift | |
| Diag 3 shift | |

Here there is a column for each unique sub-matrix (SM) index, and the diagonals for that SM are listed in the vertical direction. The system runs from left to right through the SM indices, and for each SM index the system runs through the different diagonals in cyclic fashion (as described above, there may be up to four diagonals in a sub-matrix). The starting point for running through these diagonals (in the vertical dimension) is given by the iteration index, modulo the number of diagonals present in the SM. For example, if there are two diagonals (Diag 0 and Diag 1), in the first iteration, 1÷2=0, remainder 1 so Diag 1 will be referenced first and in the second iteration, 2÷2=1, remainder 0 so the other diagonal, Diag 0, will be referenced first, etc. This means that on each iteration a different diagonal becomes the last to be processed; and hence if there are clashing bit-nodes in two diagonals, then those bit-nodes will cyclically get the chance to participate in different check nodes.

The format shown in the table may include unused locations since not every SM has the maximum number of diagonals; however the space required to store the table may be reduced if the dimensions of the table are configurable according to the code. If there are no multi-diagonals, the "num diagonals" row is not needed and the table reduces to 2 rows. If the maximum number of diagonals in the code is fewer than 4, the number of rows for recording the diagonals can be reduced accordingly. This makes fairly efficient use of memory because the low-rate codes have large numbers of SM rows, but they also tend to have fewer non-null SMs per row, and fewer multi-diagonals.

In the examples described above it has been assumed that the CNB size, $P_{CNB}$, is selected as an integer sub-multiple of the sub-matrix size, S. For some codes, such as GB20600 which uses a sub-matrix size which is prime (S=127), this is not possible. In such an instance, the number of CNBs within a sub-matrix remains an integer; however, the CNBs vary in size depending upon their position within the H-matrix. In many examples, all the CNBs except the last one will have a constant size and then the last CNB will have a slightly different size (e.g. a smaller size). This is more efficient than having many CNBs of different sizes and reduces the complexity of the control system. Furthermore, to maximize efficiency, the CNB size is also matched as closely as possible to the number of processing paths (i.e. the number of check node processing systems, P) available within the decoder.

If two CNBs containing one or more bit nodes in common are processed sequentially then it may become necessary to stall in order to ensure that the bit nodes from the first CNB have returned to the λ RAM before processing the second CNB. The order in which CNBs are processed does not, in general, impact on the performance of the code and so to minimize such stalling, the order of CNB processing may be selected for each code, to avoid shared bit nodes in sequentially processed CNBs.

Two equations are given above for use in calculating check-to-bit node messages (equation (1)) and updates to bit node values (equation (2)). Equation (1) uses an approximation which is known as the 'min-sum approximation' and this greatly simplifies the following equation for a check-to-bit node message which comprises a sum of all the messages received (in this iteration, at check node i) from the connected bit node, excluding the bit node j that the message is being sent to:

$$|R_{ij}[k]| = \psi^{-1}\left[\sum_{j'\in R[i]\setminus j} \psi(|Q_{j'i}[k]|)\right] - \text{sign}(R_{ij}[k]) = \prod_{j'\in R[i]\setminus j} \text{sign}(Q_{j'i}[k]) \quad (3)$$

where $$\psi(x) = -\frac{1}{2}\log\left(\tanh\left(\frac{x}{2}\right)\right),$$

and R[i] is the index set of bit nodes connected to check node i.

The expression for $\text{sign}(R_{ij}[k])$ is effectively a kind of XOR function on the sign bits of the $Q_{j'i}[k]$ messages (i.e. two like signs=+ and two different signs=−). Secondly, the sum of the tan h functions can be replaced by a simple minimum, so this gives:

$$R_{ij}[0] = 0 \quad (4)$$

$$|R_{ij}[k]| = \underset{j'\in R[i]\setminus j}{\text{MIN}} \{|Q_{j'i}[k]|\}$$

$$\text{sign}(R_{ij}[k]) = \underset{j'\in R[i]\setminus j}{\text{XOR}} \{\text{sign}(Q_{j'i}[k])\}$$

The sign correction factor $\delta_{ij}$ in equation (1) above is determined based on the XOR function of signs as shown in equation (4).

This formulation reduces the storage required for check-to-bit messages, since all such messages have a magnitude equal to the minimum received bit-to-check message magnitude, except for the message back to the bit node that supplied that minimum magnitude. The magnitude of the message to that bit node is the next-minimum received magnitude. Thus the check-to-bit message data for a check node can be stored in the form of a minimum magnitude, a next minimum magnitude, the index of the bit node supplying the minimum magnitude, and a set of sign bits.

Assuming that an LLR is formulated such that a +ve value indicates a 0 and a −ve value indicates a 1, thus to perform a parity check on a bunch of LLRs, the sign of the bit that is being predicted can be obtained by performing the XOR sign function described above. The confidence in that parity check is roughly equal to the lowest confidence to be found among the LLRs that are being combined; since this is the "weakest link in the chain".

However, equation (4) gives a magnitude that is on average slightly too high. Whilst equation (3) gives a more accurate answer, it is very computationally intensive. In order to improve the result given using the min-sum approximation (and equation (4)), the resultant equation may be modified by a variable offset which is dependent on the difference between the minimum that is being considered (i.e. the MIN value in equation (4)) and the next-minimum magnitude from among the other bit-to-check node messages. This difference value is scaled to produce an offset using two fixed parameters: maxOffset and diffScaling. The larger the difference, the smaller the offset to be subtracted. diffScaling sets the difference value above which no offset will be subtracted; and maxOffset sets the largest offset (that will be subtracted when the difference is 0). The offset to subtract may therefore be given by:

$$\text{MAX}\{0, \text{maxOffset}-(d\times\text{diffScaling})\} \quad (5)$$

where d is the difference value.

Taking this offset into consideration, equation (1) above may be modified to:

$$m'_i[k] = \underset{j'\in R[i]}{\text{MIN}}(|Q_j[L-1] - R_{ij}[k-1]|) \quad (6)$$

$$m''_i[k] = \underset{j'\in R[i]\setminus j_{min}}{\text{MIN}}(|Q_j[L-1] - R_{ij}[k-1]|)$$

$$m'''_i[k] = \underset{j'\in R[i]\setminus\{j_{min}, j_{next\_min}\}}{\text{MIN}}(|Q_j[L-1] - R_{ij}[k-1]|)$$

-continued $$d'_i = m''_i[k] - m'_i[k]$$

$$d''_i = m'''_i[k] - m''_i[k]$$

$$R_{ij}[k] = \delta_{ij} \cdot \begin{cases} m''_i[k] - \text{MAX}\{0, \eta' - (d'_i \times \phi')\} & \text{for } j = j_{min} \\ m'_i[k] - \text{MAX}\{0, \eta'' - (d''_i \times \phi'')\} & \text{otherwise} \end{cases}$$

Where:
$j_{min}$ and $j_{nextmin}$ are the bit node indices which give rise to magnitudes $m'_i[k]$ and $m''_i[k]$ respectively ($m'_i[k]$ being the minimum bit-to-check message magnitude, and $m''_i[k]$ being the next-minimum magnitude)
$\eta'$ and $\eta''$ are the maxDiff constant values specified for the minimum and next-minimum values respectively
$\phi'$ and $\phi''$ are the diffScaling constant values specified for the minimum and next-minimum values respectively.

Although the modifications to the min-sum approximation (as shown in equation (6)) are described herein with reference to use in an LDPC decoder as described above, it will be appreciated that this modified algorithm may be used in many different applications and situations, e.g. wherever equation (1) might otherwise be used. As described above, by using this modification instead of the standard min-sum algorithm, the resultant LLR which is calculated is more accurate.

Figure 14:
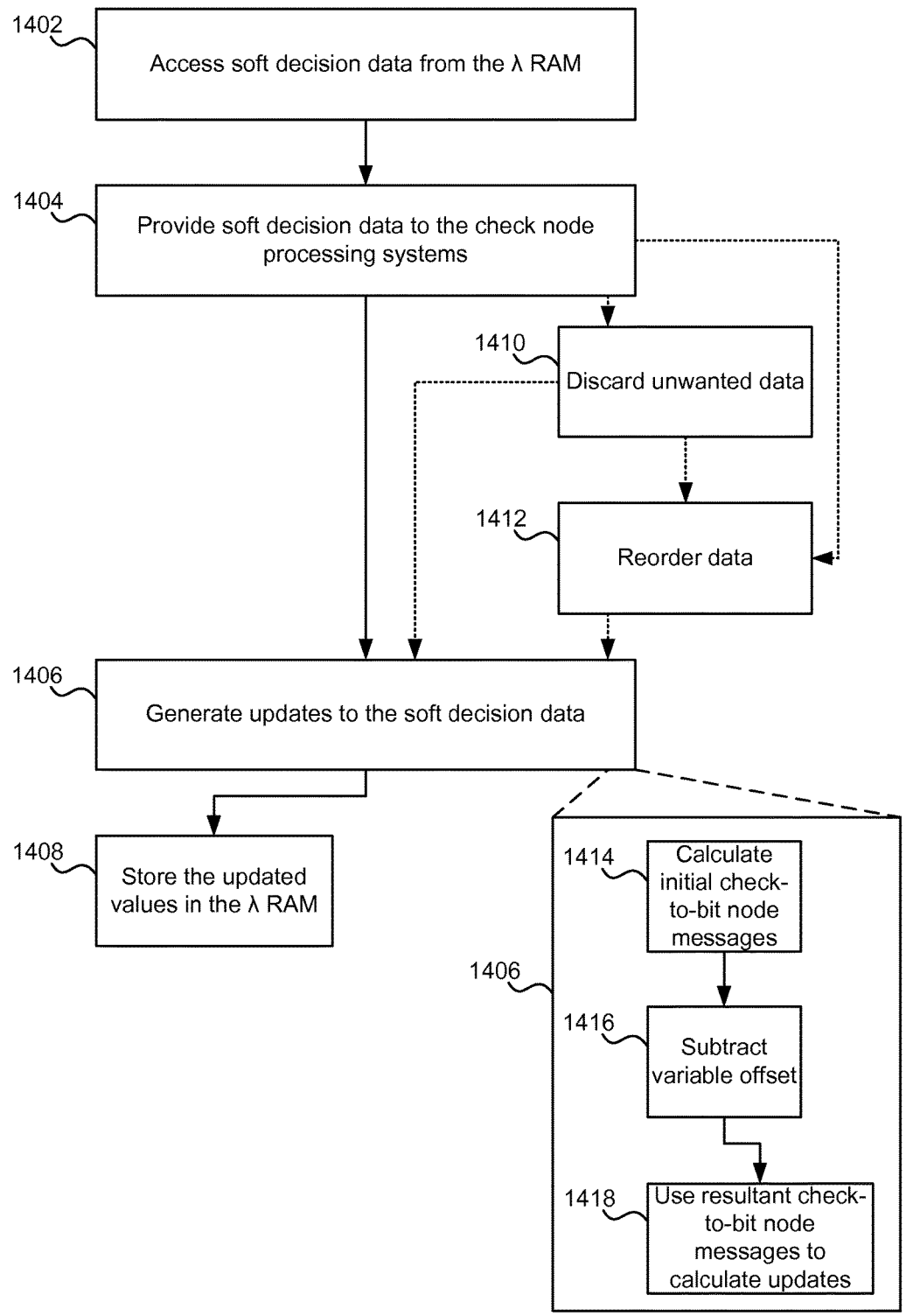
FIG. 14 shows a flow diagram of an example method of operation of an LDPC decoder.

FIG. 14 shows a flow diagram of an example method of operation of an LDPC decoder as described above (e.g. as shown in FIGS. 5, 7 and 9). As described above, the method comprising accessing soft decision data for a check node block from the λ RAM (block 1402), where the λ RAM comprises a number of independently addressable memories and where the total width of the memories is larger than P*q. This data may be accessed using a shuffling system (as described above) and is then provided (by the shuffling system) to a plurality of check node processing systems (block 1404) which operate in parallel. These check node processing systems, generate updates to the soft decision data in parallel (block 1406) and the updated soft decision data is then stored back into the λ RAM (block 1408).

As described above, where more data is accessed in a single cycle than is required by the check node processing systems, the unwanted data is discarded (block 1410) by the shuffling system. The shuffling system reorders the accessed data (block 1412) and this reordering ensures that data is delivered to the check node processing systems in a consistent order and may also comprise closing any gaps created in the data by the discarding of data (in block 1410).

As described above, a modified min-sum algorithm (e.g. equation (6)) may be used to generate the updates to the soft decision data (in block 1406) and this involves using a standard min-sum algorithm (block 1414) and then subtracting a variable offset from the output of the min-sum algorithm (block 1416). As described above, the variable offset may be calculated using equation (5) above. The resultant check-to-bit node messages are then used to calculate the updated soft decision data (block 1418).

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise an exclusive list and an apparatus may contain additional blocks or elements and a method may contain additional operations or elements.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A configurable LDPC decoder arranged to support multiple different LDPC code structures having any sub-matrix size, comprising:
    a plurality of independently addressable memories arranged collectively to store soft decision data for each bit node for use in decoding an LDPC code, each memory having a width comprising an amount of data accessible from the memory in a single cycle;
    a plurality of check node processing systems arranged to operate in parallel and generate updates to the soft decision data;
    a first shuffling system arranged to pass data from the plurality of independently addressable memories to the plurality of check node processing systems; and
    a second shuffling system arranged to pass the updates to the soft decision data from the plurality of check node processing systems to the plurality of independently addressable memories,
    wherein a total width of the plurality of independently addressable memories is larger than a product of a number of check nodes processed in parallel by the check node processing systems and a width of the soft decision data for a bit node.

2. A configurable LDPC decoder according to claim 1, wherein a parity check matrix for the LDPC code comprises a plurality of sub-matrices, a check node block comprises a group of check nodes processed in parallel by the check node processing systems and a sub-matrix comprises a plurality of check node blocks.

3. A configurable LDPC decoder according to claim 2, wherein the plurality of independently addressable memories comprises M independently addressable memories, each memory comprises a plurality of memory locations, each memory location is arranged to store soft decision data for a plurality of bit nodes and wherein the bit nodes in each sub-matrix of said parity check matrix are distributed among X memory locations, where X is a multiple of M and M and X are integers.

4. A configurable LDPC decoder according to claim 2, wherein the plurality of independently addressable memories comprises a first plurality of independently addressable memories and at least one additional independently addressable memory, each memory in the first plurality of independently addressable memories having a width equal to a product of the width of the soft decision data for a bit node and a number of check nodes in a check node block.

5. A configurable LDPC decoder according to claim 4, wherein each additional independently addressable memory has a width equal to the product of the width of the soft decision data for a bit node and the number of check nodes in a check node block.

6. A configurable LDPC decoder according to claim 2, wherein the plurality of independently addressable memories comprises M independently addressable memories, the plurality of check node processing systems comprises P check node processing systems, the width of the soft decision data for a bit node is q and the width of each memory is larger than P*q/M.

7. A configurable LDPC decoder according to claim 6, wherein M=3 or M=2.

8. A configurable LDPC decoder according to claim 6, wherein the width of each memory is 2*P*q/M.

9. A configurable LDPC decoder according to claim 2, wherein the first shuffling system is arranged to access a plurality of memory locations to obtain data for processing by the plurality of check node processing systems and discard any accessed data from within those memory locations which will not be used by the plurality of check node processing systems in a single cycle.

10. A configurable LDPC decoder according to claim 9, wherein the first shuffling system comprises gap closing hardware arranged to eliminate any gaps in the data accessed from the plurality of memory locations caused by discarded data.

11. A configurable LDPC decoder according to claim 2, wherein the parity check matrix comprises sub-matrices containing cyclically shifted identity matrices, each identity matrix being referred to as a diagonal, and wherein the first shuffling system is arranged to cyclically rotate an order in which the diagonals are referenced when accessing data from the plurality of independently addressable memories.

12. A configurable LDPC decoder according to claim 11, wherein a sub-matrix comprises D diagonals, each diagonal in the sub-matrix has an index and for a given iteration, L, the diagonals are referenced in an order according to their indices, starting with an index given by L modulo D.

13. A configurable LDPC decoder according to claim 1, wherein each check node processing system generates updates to soft decision data for a bit node using check-to-bit node messages for each check node connected to the bit node and wherein each check-to-bit node message is calculated using a min-sum algorithm and a variable offset, wherein the variable offset is calculated based on differences between lowest-valued bit-to-check message magnitudes.

14. A configurable LDPC decoder according to claim 13, wherein the variable offset is subtracted from an initial bit-to check node message calculated using the min-sum algorithm.

15. A method of decoding an LDPC code comprising:
    accessing, in a single cycle, soft decision data for a plurality of bit nodes from a plurality of independently addressable memories, each memory having a width and the width of a memory comprising an amount of data accessible from the memory in a single cycle;
    providing the accessed soft decision data to a plurality of check node processing systems;
    generating updates to the soft decision data for the plurality of bit nodes in parallel in the check node processing systems; and
    storing updated soft decision data for the plurality of bit nodes in the plurality of independently addressable memories,
    wherein in at least one cycle, accessing soft decision data for a plurality of bit nodes comprises accessing a total amount of soft decision data which is larger than a product of a number of check nodes processed in parallel by the check node processing systems and a width of the soft decision data for a bit node.

16. A method according to claim 15, further comprising, in the at least one cycle, accessing a plurality of memory locations to obtain data for processing by the plurality of check node processing systems, and discarding any accessed data from within those memory locations which will not be used by the plurality of check node processing systems in a single cycle prior to providing the data to the check node processing systems.

17. A method according to claim 15, wherein a parity check matrix for the LDPC code comprises a plurality of sub-matrices, a check node block comprises a group of check nodes processed in parallel by the check node processing systems, a sub-matrix comprises a plurality of check node blocks and at least one check node block comprises two or more diagonals and wherein accessing, in a single cycle, soft decision data for a plurality of bit nodes from a plurality of independently addressable memories comprises:

cyclically rotating an order in which the diagonals are referenced when accessing data from the plurality of independently addressable memories.

18. A method according to claim 17, wherein a sub-matrix of said parity check matrix comprises D diagonals, each diagonal in the sub-matrix has an index and for a given iteration, L, and the diagonals are referenced in an order according to their indices, starting with an index given by L modulo D.

19. A method according to claim 15, wherein generating updates to the soft decision data for the plurality of bit nodes in parallel in the check node processing systems comprises, for each bit node:

calculating initial check-to-bit node messages for each check node connected to the bit node using a min-sum algorithm;

subtracting a variable offset from each initial check-to-bit node message to generate final check-to-bit node messages for each check node connected to the bit node, wherein the variable offset is calculated based on differences between lowest-valued bit-to-check node messages; and calculating an update to the soft decision data based on the final check-to-bit node messages for each bit node connected to the check node.

20. A non-transitory computer readable storage medium having stored thereon computer readable program code for generating a processor comprising an LDPC decoder, the LDPC decoder comprising:

a plurality of independently addressable memories arranged collectively to store soft decision data for each bit node for use in decoding an LDPC code and each memory having a width, the width of a memory comprising an amount of data accessible from the memory in a single cycle;

a plurality of check node processing systems arranged to operate in parallel and generate updates to the bit node soft decision data;

a first shuffling system arranged to pass data from the plurality of independently addressable memories to the plurality of check node processing systems; and a second shuffling system arranged to pass updates to the bit node soft decision data from the plurality of check node processing systems to the plurality of independently addressable memories;

wherein a total width of the plurality of independently addressable memories is larger than a product of a number of check nodes processed in parallel by the check node processing systems and a width of the soft decision data for a bit node.

* * * * *